US008110924B2

(12) United States Patent
Nakamura et al.

(10) Patent No.: US 8,110,924 B2
(45) Date of Patent: Feb. 7, 2012

(54) SEMICONDUCTOR DEVICE AND METHOD FOR MANUFACTURING SAME

(75) Inventors: Kazutoshi Nakamura, Kanagawa-ken (JP); Norio Yasuhara, Kanagawa-ken (JP); Tomoko Matsudai, Tokyo (JP); Daisuke Minohara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 12/408,390

(22) Filed: Mar. 20, 2009

(65) Prior Publication Data
US 2009/0243087 A1 Oct. 1, 2009

(30) Foreign Application Priority Data

Mar. 25, 2008 (JP) ................. 2008-078701
Aug. 20, 2008 (JP) ................. 2008-212253

(51) Int. Cl.
*H01L 23/48* (2006.01)
*H01L 23/52* (2006.01)
*H01L 29/40* (2006.01)
(52) U.S. Cl. . 257/758; 438/613; 257/737; 257/E21.589; 257/E23.068
(58) Field of Classification Search ............ 257/E21.589
See application file for complete search history.

(56) References Cited

U.S. PATENT DOCUMENTS

| 2003/0036256 A1* | 2/2003 | Efland et al. ................. 438/613 |
| 2005/0258484 A1* | 11/2005 | Itou .............................. 257/341 |

* cited by examiner

*Primary Examiner* — Ha Tran T Nguyen
*Assistant Examiner* — Shaka Scarlett
(74) *Attorney, Agent, or Firm* — Patterson & Sheridan, LLP

(57) ABSTRACT

In a DC-DC converter, a multilayer wiring layer is provided on a silicon substrate, and a control circuit configured to control an input circuit and an output circuit is formed in the silicon substrate and the multilayer wiring layer. Moreover, a sealing resin layer covering the multilayer wiring layer and a connecting member connected to an uppermost wiring of the multilayer wiring layer, penetrating the sealing resin layer and having an upper end portion protruding from an upper surface of the sealing resin layer are provided. The upper end portion of the connecting member is formed from a protruding electrode. Horizontal cross-sectional area of the connecting member connected to terminals of the output circuit is larger than horizontal cross-sectional area of the connecting member connected to terminals of the control circuit.

20 Claims, 31 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2008-78701, filed on Mar. 25, 2008 and the prior Japanese Patent Application No. 2008-212253, filed on Aug. 20, 2008; the entire contents of which are incorporated herein by reference.

BACKGROUND OF THE INVENTION

1. Field of the Invention

This invention relates to a semiconductor device in which an output circuit for driving a large current and a control circuit for controlling this output circuit are formed on the same semiconductor substrate, and a method for manufacturing the same.

2. Background Art

Recently, with the decrease of the operating voltage of CPU (central processing unit) in computers and the like, a synchronous buck converter is often used as a CPU power supply. Furthermore, higher current response (di/dt) is increasingly required for the CPU power supply, and ripple suppression in the output voltage of the power supply is also required. Thus, enhancing the speed of the power supply has been important.

A synchronous buck converter is a step-down DC-DC converter. The DC-DC converter includes a high-side discrete element, a low-side discrete element, and a driver circuit for driving them, which are housed in separate packages and interconnected on a printed circuit board. An input potential is applied to the high-side discrete element, and a reference potential is applied to the low-side discrete element, so that these elements are alternately brought into conduction. At this time, a rectangular voltage pulse is outputted from the intermediate node between these elements and smoothed by an LC circuit to obtain a DC voltage. However, the enhancement of current response (di/dt) makes it impossible to neglect the decrease of conversion efficiency due to inductance on the printed circuit board and inductance of wire bonding in the packages.

Thus, it is contemplated to integrate the high-side element, the low-side element, and the driver circuit into one chip. However, increased chip size is needed for higher output current in this type of power supply chip, but it results in increased interconnection resistance in the chip.

In this context, a packaging method for reducing wiring resistance by bump connection is proposed in Z. J. Shen, et al., "Breaking the Scaling Barrier of Large Area Lateral Power Devices: An 1 mΩ Flip-Chip Power MOSFET with Ultra Low Gate Charge", ISPSD '04, pp. 387-390. In this packaging method, a multilayer wiring layer is provided on the semiconductor substrate on which the elements and the driver circuit are formed, and multiple terminals of the elements and the driver circuit are bunched into fewer uppermost wirings. Bumps are provided on the uppermost wirings, and used to mount the chip on the printed circuit board. Thus, the uppermost wirings are connected to the wirings of the printed circuit board. In this case, the wiring resistance decreases with the increase of the arrangement density of bumps.

However, a problem in this technique is that the layout of the wirings of the printed circuit board constrains the bump spacing and interferes with sufficiently increasing the density. To sufficiently reduce wiring resistance, the wirings of the printed circuit board may be designed with higher density in accordance with the bump arrangement of the power supply chip. However, to this end, the method for manufacturing the printed circuit board needs to be changed so that the density of its wirings can be increased, which increases cost.

SUMMARY OF THE INVENTION

According to an aspect of the invention, there is provided a semiconductor device including: a semiconductor substrate; a multilayer wiring layer provided on the semiconductor substrate and constituting, in combination with the semiconductor substrate, an output circuit and a control circuit configured to control the output circuit; a sealing resin layer covering the multilayer wiring layer; and a connecting member connected to an uppermost wiring of the multilayer wiring layer, penetrating through the sealing resin layer, and having an upper end portion protruding from an upper surface of the sealing resin layer, horizontal cross-sectional area of the connecting member connected to terminals of the output circuit being larger than horizontal cross-sectional area of the connecting member connected to terminals of the control circuit.

According to another aspect of the invention, there is provided a method for manufacturing a semiconductor device, including: forming a multilayer wiring layer on a semiconductor substrate, the multilayer wiring layer constituting, in combination with the semiconductor substrate, an output circuit and a control circuit configured to control the output circuit; forming an extraction wiring on the multilayer wiring layer, the extraction wiring being connected to an uppermost wiring of the multilayer wiring layer; forming a columnar electrode on the extraction wiring; forming a sealing resin layer on the multilayer wiring layer so as to cover the extraction wiring and the columnar electrode; polishing an upper surface of the sealing resin layer to expose the columnar electrode; forming a solder resist film on the sealing resin layer and the columnar electrode; removing a portion of the solder resist film located immediately above the columnar electrode to form an opening; and forming a protruding electrode in the opening, horizontal cross-sectional area of the columnar electrode and the protruding electrode connected to terminals of the output circuit being larger than horizontal cross-sectional area of the columnar electrode and the protruding electrode connected to terminals of the control circuit.

According to still another aspect of the invention, there is provided a method for manufacturing a semiconductor device, including: forming a multilayer wiring layer on a semiconductor substrate, the multilayer wiring layer constituting, in combination with the semiconductor substrate, an output circuit and a control circuit configured to control the output circuit; forming an extraction wiring on the multilayer wiring layer, the extraction wiring being connected to an uppermost wiring of the multilayer wiring layer; forming a columnar electrode on the extraction wiring; forming a sealing resin layer on the multilayer wiring layer so as to cover the extraction wiring and the columnar electrode; polishing an upper surface of the sealing resin layer to expose the columnar electrode; forming a plurality of protruding electrodes on the columnar electrode; forming a solder resist film on the sealing resin layer and the columnar electrode so as to cover the protruding electrodes; and removing a portion of the solder resist film formed on the protruding electrodes, horizontal cross-sectional area of the columnar electrode and the protruding electrode connected to terminals of the output circuit being larger than horizontal cross-sectional area of the columnar electrode and the protruding electrode connected to terminals of the control circuit.

DETAILED DESCRIPTION OF THE INVENTION

Embodiments of the invention will now be described with reference to the drawings.

To begin with, a first embodiment of the invention is described.

Figure 1:
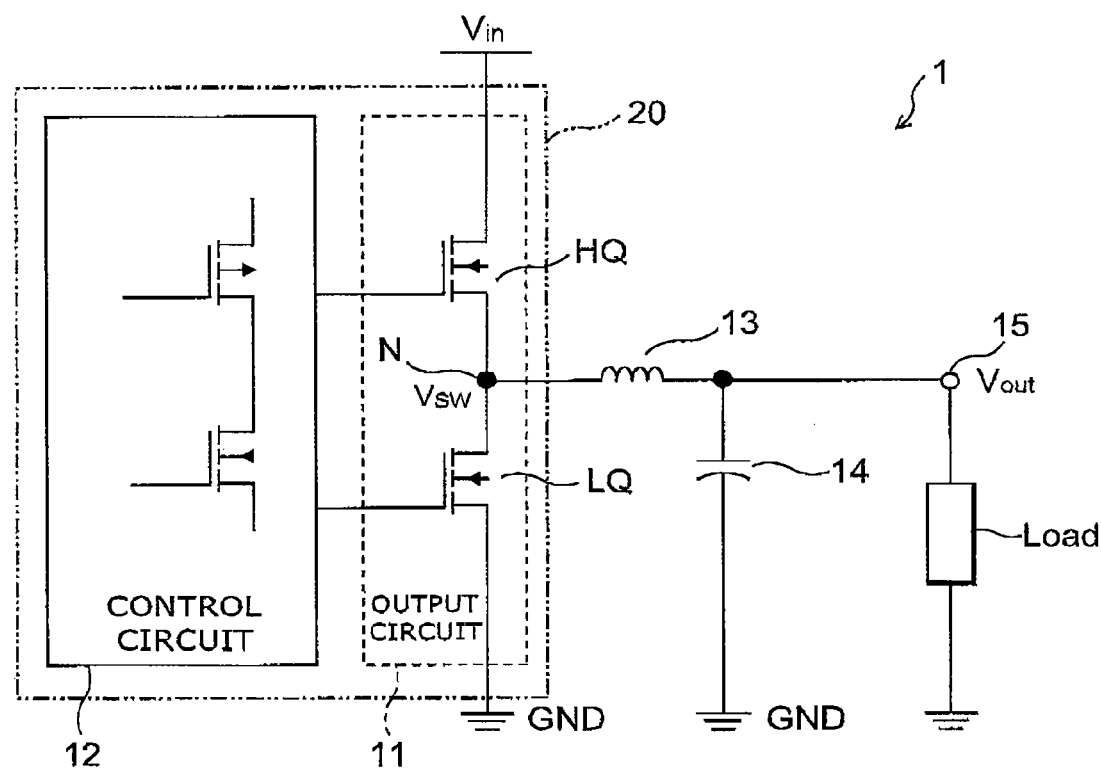
FIG. 1 is a circuit diagram illustrating a semiconductor device according to a first embodiment of the invention.

FIG. 1 is a circuit diagram illustrating a semiconductor device according to this embodiment.

Figure 2:
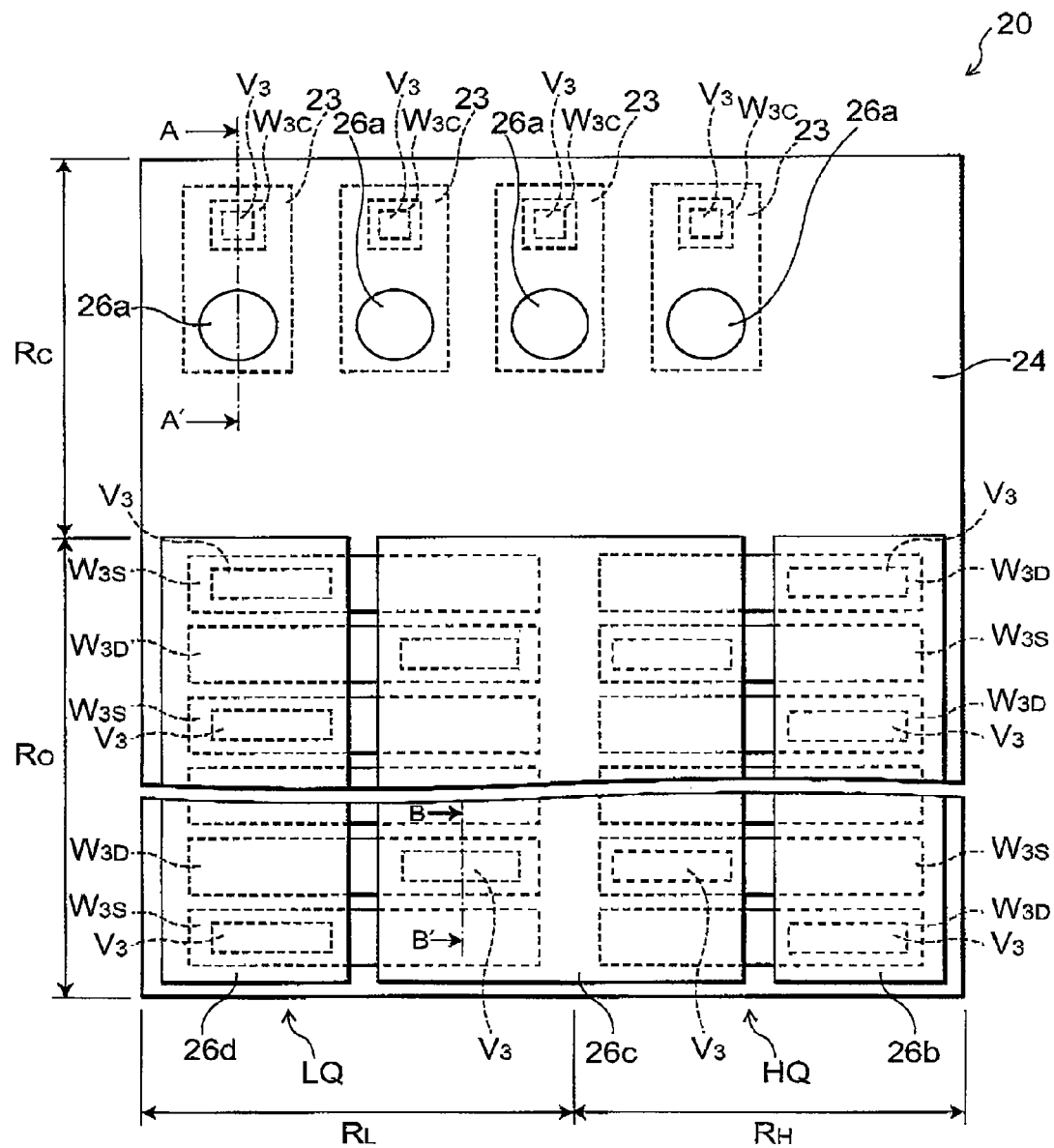
FIG. 2 is a plan view illustrating the uppermost layer of a semiconductor chip of the semiconductor device according to the first embodiment.

FIG. 2 is a plan view illustrating the uppermost layer of a semiconductor chip of the semiconductor device according to this embodiment.

Figure 3:
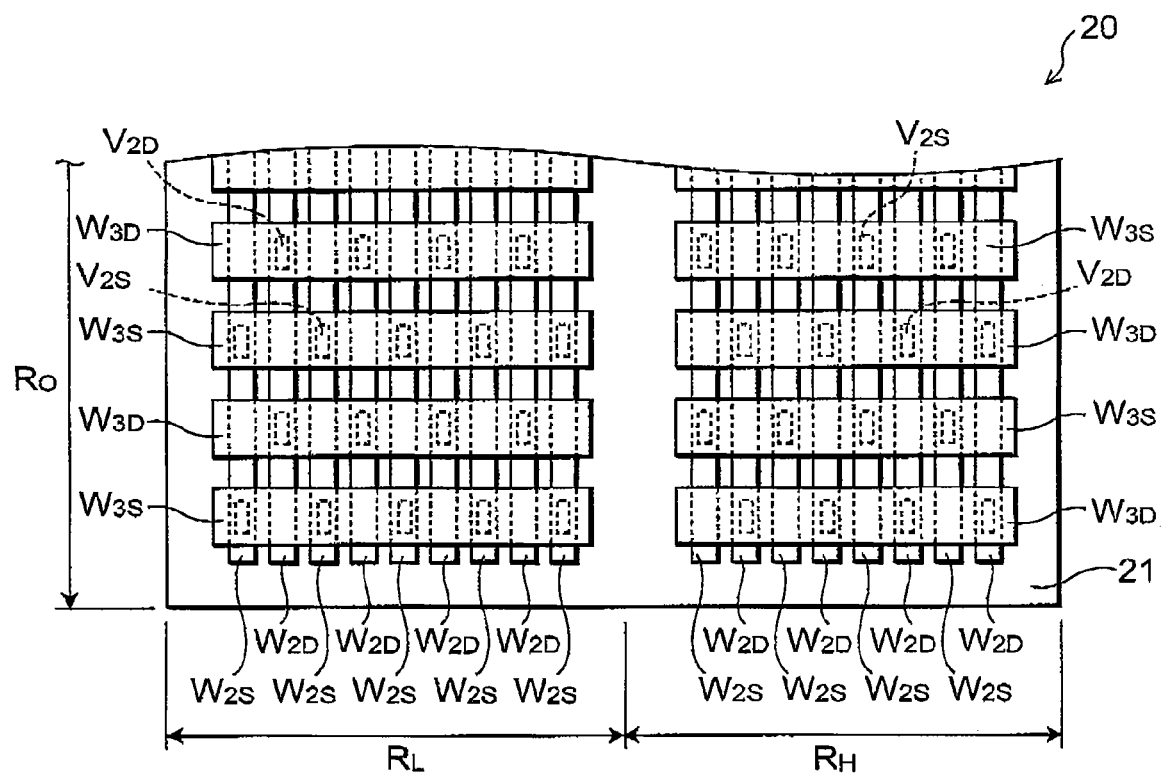
FIG. 3 is a plan view illustrating a third wiring layer of the output circuit region of the semiconductor chip show in FIG. 2.

FIG. 3 is a plan view illustrating a third wiring layer of the output circuit region of the semiconductor chip show in FIG. 2.

Figure 4:
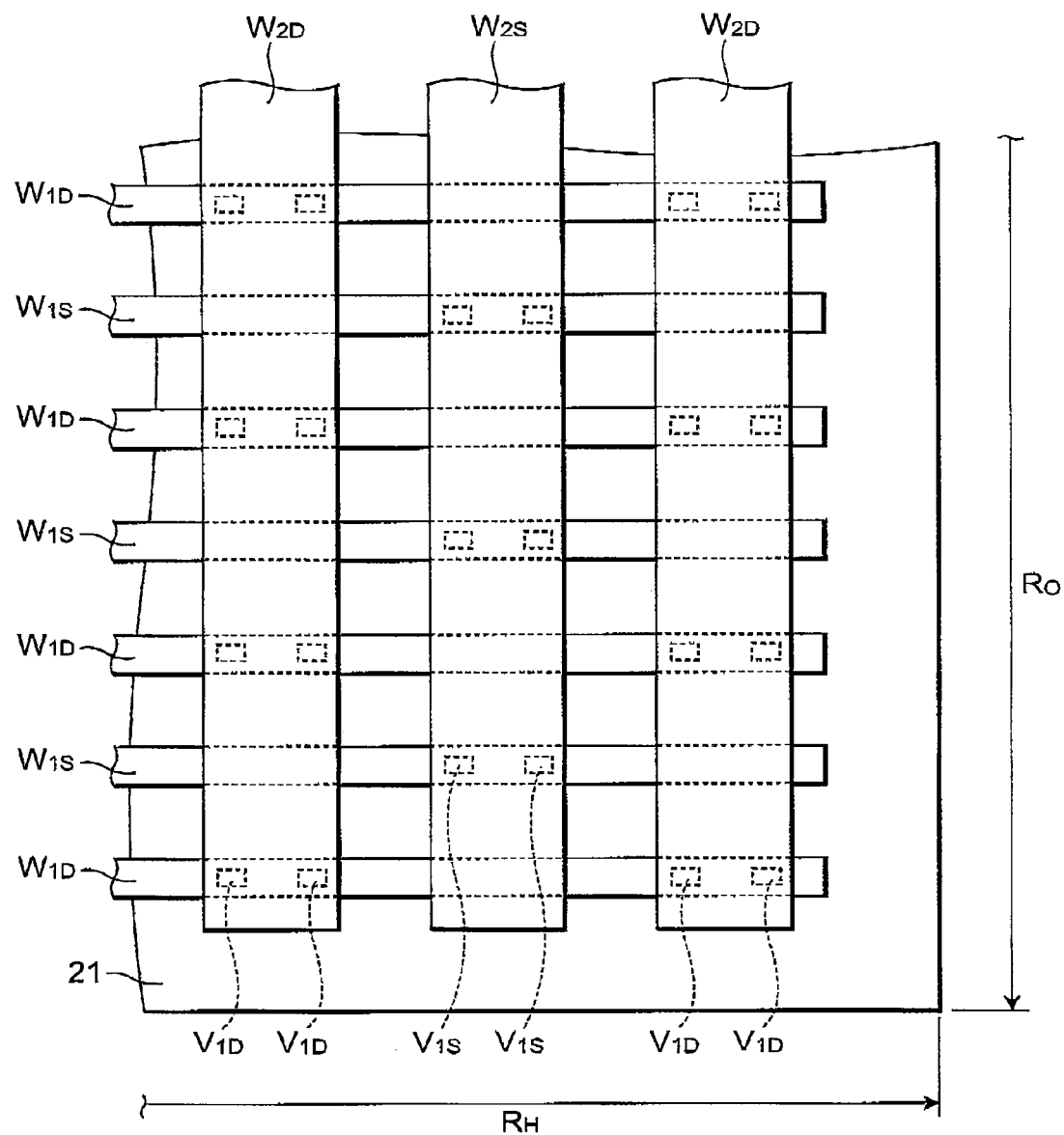
FIG. 4 is a plan view illustrating a second wiring layer of the output circuit region of the semiconductor chip show in FIG. 3.

FIG. 4 is a plan view illustrating a second wiring layer of the output circuit region of the semiconductor chip show in FIG. 3.

Here, FIG. 3 shows a lower and limited region as compared with FIG. 2, and FIG. 4 shows a lower and limited region as compared with FIG. 3.

Figure 5:
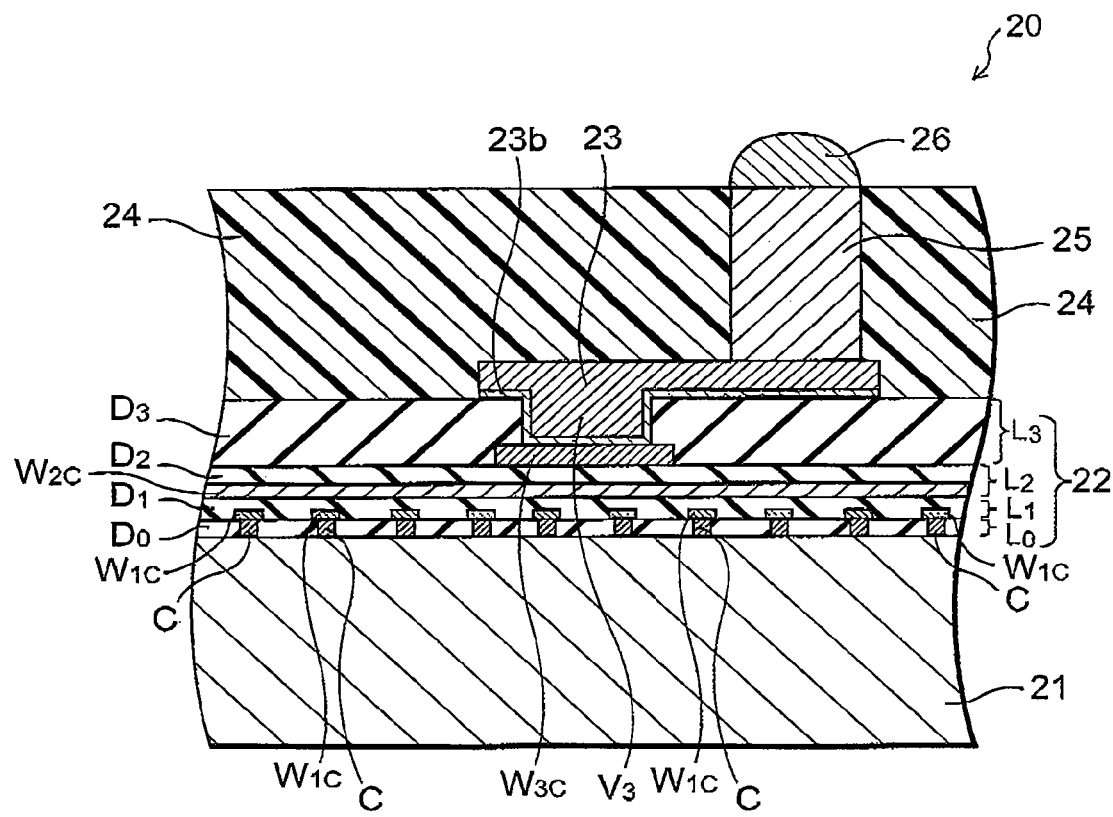
FIG. 5 is a cross-sectional view taken along line A-A' shown in FIG. 2.

FIG. 5 is a cross-sectional view taken along line A-A' shown in FIG. 2.

Figure 6:
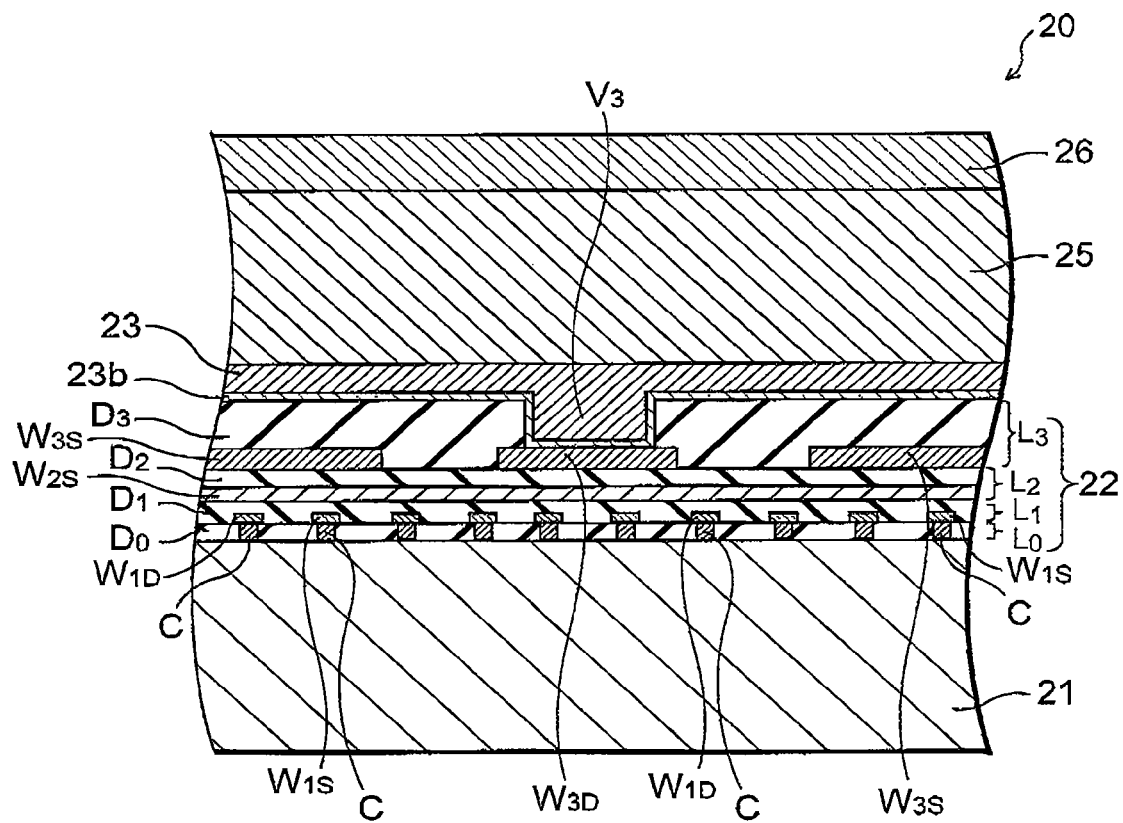
FIG. 6 is a cross-sectional view taken along line B-B' shown in FIG. 2.

FIG. 6 is a cross-sectional view taken along line B-B' shown in FIG. 2.

The semiconductor device according to this embodiment is a DC-DC converter, such as a non-insulated DC-DC converter for fast switching. As shown in FIG. 1, in the DC-DC converter 1 according to this embodiment, an output circuit 11 is connected between an input potential $V_{in}$ and the ground potential GND serving as a reference potential. In the output circuit 11, a high-side transistor HQ illustratively made of N-type MOSFET (metal oxide semiconductor field effect transistor) and a low-side transistor LQ illustratively made of N-type MOSFET are connected in series. More specifically, the input potential $V_{in}$ is applied to the drain of the high-side transistor HQ, the source of the high-side transistor HQ is connected to the drain of the low-side transistor LQ, and the ground potential GND is applied to the source of the low-side transistor LQ. It is noted that the high-side transistor may be a P-type MOSFET.

The DC-DC converter 1 further includes a control circuit 12 for controlling the output circuit 11. The control circuit 12 controls the gate potential of the high-side transistor HQ and the gate potential of the low-side transistor LQ to switch conduction/non-conduction of each of the transistors HQ and LQ. The control circuit 12 is illustratively composed of CMOS (complementary metal oxide semiconductor) circuits made of P-type MOSFETs and N-type MOSFETs. The output circuit 11 and the control circuit 12 are formed on a single semiconductor chip 20.

Furthermore, the DC-DC converter 1 includes an inductor 13 and a capacitor 14 outside the semiconductor chip 20. The inductor 13 is connected between the output terminal 15 and the junction N of the high-side transistor HQ and the low-side transistor LQ, and the capacitor 14 is connected between the output terminal 15 and the ground potential GND. Thus, the inductor 13 and the capacitor 14 constitute an LC circuit. Furthermore, a load is connected between the output terminal 15 and the ground potential GND. Thus, a current is supplied from the output terminal 15 to the load. The semiconductor chip 20, the inductor 13, and the capacitor 14 are mounted on one printed circuit board (not shown), and interconnected by wirings printed on the printed circuit board.

In the following, the semiconductor chip 20 is described.

As shown in FIGS. 2 to 6, the semiconductor chip 20 illustratively includes a silicon substrate 21 as a semiconductor substrate. A multilayer wiring layer 22 is provided on the silicon substrate 21. The output circuit 11 and the control circuit 12 described above are formed in the silicon substrate 21 and the multilayer wiring layer 22. The output circuit 11 is formed in an output circuit region $R_O$ of the semiconductor chip 20, and the control circuit 12 is formed in a control circuit region $R_C$ of the semiconductor chip 20. The output circuit region $R_O$ is subdivided into a high-side region $R_H$ including high-side transistors HQ and a low-side region $R_L$ including low-side transistors LQ.

As shown in FIGS. 5 and 6, in the multilayer wiring layer 22, a plurality of, e.g., three, wiring layers are stacked. More specifically, a first wiring layer $L_1$, a second wiring layer $L_2$, and a third wiring layer $L_3$ are formed in this order from the silicon substrate 21 side. As described later, each wiring layer is made of wirings and vias buried in a dielectric film. Furthermore, a foundation dielectric layer $L_0$ is provided below the first wiring layer $L_1$. The foundation dielectric layer $L_0$ includes a dielectric film $D_0$, in which contacts C are buried. It is noted that in FIGS. 5 and 6, diffusion layers in the silicon substrate 21 constituting the transistors are not shown.

As shown in FIGS. 4 and 6, in the first wiring layer $L_1$ of the high-side region $R_H$, first source wirings $W_{1S}$ and first drain wirings $W_{1D}$ are provided alternately and parallel to each other. The first source wiring $W_{1S}$ and the first drain wiring $W_{1D}$ are connected, respectively, to the source region and the drain region of the high-side transistor HQ through the contacts C buried in the dielectric film $D_0$. More specifically, in the silicon substrate 21, a source region is formed immediately below each first source wiring $W_{1S}$, a drain region is formed immediately below each first drain wiring $W_{1D}$, and a channel region is formed between the source region and the drain region. Hence, the arrangement pitch of the first source wirings $W_{1S}$ and the first drain wirings $W_{1D}$ is equal to the arrangement pitch of the transistors HQ, and is illustratively several microns.

Likewise, also in the low-side region $R_L$, first source wirings $W_{1S}$ and first drain wirings $W_{1D}$ are provided alternately and parallel to each other, and connected, respectively, to the source regions and the drain regions of the transistors LQ. The first wiring layer $L_1$ includes a dielectric film $D_1$ so as to cover the first source wirings $W_{1S}$ and the first drain wirings $W_{1D}$.

In the second wiring layer $L_2$, second source wirings $W_{2S}$ and second drain wirings $W_{2D}$ are provided alternately and parallel to each other. The extending direction of the second source wirings $W_{2S}$ and the second drain wirings $W_{2D}$ is orthogonal to the extending direction of the first source wirings Was and the first drain wirings $W_{1D}$ of the first wiring layer $L_1$. The arrangement pitch of the second source wirings $W_{2S}$ and the second drain wirings $W_{2D}$ is larger than the arrangement pitch of the first source wirings $W_{1S}$ and the first drain wirings $W_{1D}$, and is illustratively several ten microns. Furthermore, the width of the second source wiring $W_{2S}$ and the second drain wiring $W_{2D}$ is larger than the width of the first source wiring $W_{1S}$ and the first drain wiring $W_{1D}$. The second source wiring $W_{2S}$ is connected to the first source wiring $W_{1S}$ through a via $V_{1S}$, and the second drain wiring $W_{2D}$ is connected to the first drain wiring $W_{1D}$ through a via $V_{1D}$. The second wiring layer $L_2$ includes a dielectric film $D_2$ so as to cover the second source wirings $W_{2S}$ and the second drain wirings $W_{2D}$.

As shown in FIG. 3, in the third wiring layer $L_3$, third source wirings $W_{3S}$ and third drain wirings $W_{3D}$ are provided alternately and parallel to each other. The third source wiring $W_{3S}$ and the third drain wiring $W_{3D}$ are illustratively formed from aluminum (Al). The extending direction of the third source wirings $W_{3S}$ and the third drain wirings $W_{3D}$ is orthogonal to the extending direction of the second source wirings $W_{2S}$ and the second drain wirings $W_{2D}$ of the second wiring layer $L_2$, and hence coincides with the extending direction of the first source wirings $W_{1S}$ and the first drain wirings $W_{1D}$ of the first wiring layer $L_1$. The arrangement pitch of the third source wirings $W_{3S}$ and the third drain wirings $W_{3D}$ is larger than the arrangement pitch of the second source wirings $W_{2S}$ and the second drain wirings $W_{2D}$, and is illustratively several hundred microns. Furthermore, the width of the third source wiring $W_{3S}$ and the third drain wiring $W_{3D}$ is larger than the width of the second source wiring $W_{2S}$ and the second drain wiring $W_{2D}$.

The third source wiring $W_{3S}$ is connected to the second source wiring $W_{2S}$ through a via $V_{2S}$, and the third drain wiring $W_{3D}$ is connected to the second drain wiring $W_{2D}$ through a via $V_{2D}$. As shown in FIG. 6, the third wiring layer $L_3$ includes a dielectric film $D_3$ so as to cover the third source wirings $W_{3S}$ and the third drain wirings $W_{3D}$.

Thus, in the multilayer wiring layer 22, each plurality of terminals in the output circuit 11, that is, the source terminals and the drain terminals of the transistors HQ, and the source terminals and the drain terminals of the transistors LQ are bunched into the third source wirings $W_{3S}$ and the third drain wirings $W_{3D}$, which constitute the uppermost wirings of the multilayer wiring layer 22.

On the other hand, as shown in FIG. 2, in the control circuit region $R_C$, elements formed on the silicon substrate 21 are interconnected by first control wirings (not shown) of the first wiring layer $L_1$, second control wirings (not shown) of the second wiring layer $L_2$, and third control wirings $W_{3C}$ of the third wiring layer $L_3$ to constitute the control circuit 12 (see FIG. 1). Signal output from the control circuit 12 to the outside of the semiconductor chip 20 and signal input from the outside of the semiconductor chip 20 to the control circuit 12 are conducted through the third control wirings $W_{3C}$, which constitute the uppermost wirings. The third control wiring $W_{3C}$ is illustratively formed from aluminum (Al).

Furthermore, as shown in FIGS. 2, 5, and 6, extraction wirings 23 are provided on the multilayer wiring layer 22. The extraction wiring 23 is illustratively made of copper (Cu), and a barrier metal layer 23b is formed in its lower portion. The extraction wiring 23 is connected to a prescribed wiring of the third wiring layer $L_3$ through a via $V_3$ formed in the third wiring layer $L_3$. The extraction wiring 23 has a thickness of e.g. 5.5 microns.

As viewed from above, the shape of the extraction wiring 23 varies with the region in which the extraction wiring 23 is formed. More specifically, the extraction wiring 23 connected to the third control wiring $W_{3C}$ in the control circuit region $R_C$ is shaped like a line. In contrast, the extraction wiring 23 connected to the third source wiring $W_{3S}$ or the third drain wiring $W_{3D}$ in the output circuit region $R_O$ is shaped like a sheet.

In the control circuit region $R_C$, each third control wiring $W_{3C}$ is connected to one linear extraction wiring 23 through a via $V_3$. On the other hand, in the output circuit region $R_O$, the third drain wirings $W_{3D}$ each connected to the drain of a high-side transistor HQ are commonly connected to a single sheet-like extraction wiring 23 through vias $V_3$. The third source wirings $W_{3S}$ each connected to the source of a high-side transistor HQ and the third drain wirings $W_{3D}$ each connected to the drain of a low-side transistor LQ are commonly connected to another single sheet-like extraction wiring 23 through other vias $V_3$. Furthermore, the third source wirings $W_{3S}$ each connected to the source of a low-side transistor HQ are commonly connected to still another single sheet-like extraction wiring 23 through still other vias $V_3$.

The semiconductor chip 20 further includes a sealing resin layer 24 so as to cover the multilayer wiring layer 22 and the extraction wirings 23. The sealing resin layer 24 serves to protect the silicon substrate 21, the multilayer wiring layer 22, and the extraction wirings 23 from moisture and the like. The sealing resin layer 24 has a thickness of e.g. approximately 70 to 80 microns.

Furthermore, a columnar electrode 25 is provided on the extraction wiring 23. The columnar electrode 25 is illustratively made of copper, buried in the sealing resin layer 24, and connected to the extraction wiring 23 immediately therebelow, and penetrates through the sealing resin layer 24. Furthermore, a protruding electrode 26 is provided on the columnar electrode 25. The protruding electrode 26 is illustratively made of solder and protrudes from the upper surface of the sealing resin layer 24. The columnar electrode 25 and the protruding electrode 26 constitute a connecting member. That is, the upper end portion of the connecting member is the protruding electrode 26 illustratively formed from solder.

In the control circuit region $R_C$, the columnar electrode 25 is provided only partly in the immediately overlying region of the extraction wiring 23, and illustratively shaped like a cylinder with the central axis directed vertically. The protruding electrode 26 is illustratively shaped like a hemisphere. On the other hand, in the output circuit region $R_O$, the columnar electrode 25 is provided entirely or generally entirely in the immediately overlying region of the extraction wiring 23, and shaped like a plate. The protruding electrode 26 is also shaped like a plate.

Hence, the horizontal cross-sectional area of the columnar electrode 25 provided in the control circuit region $R_C$, that is, the cylindrical columnar electrode 25 connected to the terminals of the control circuit 12, is significantly different from the horizontal cross-sectional area of the columnar electrode 25 provided in the output circuit region $R_O$, that is, the plate-like columnar electrode 25 connected to the terminals of the output circuit 11. The horizontal cross-sectional area of the plate-like columnar electrode 25 connected to the terminals of the output circuit 11 is larger than the horizontal cross-sectional area of the cylindrical columnar electrode 25 connected to the terminals of the control circuit 12. Here, the horizontal cross-sectional area refers to the area of the cross section parallel to the upper surface of the silicon substrate 21.

In FIG. 2, the hemispherical protruding electrode 26 provided in the control circuit region $R_C$ and connected to the terminals of the control circuit 12 is denoted as a protruding electrode 26a. Furthermore, the plate-like protruding electrode 26 provided in the output circuit region $R_O$ and connected to the drain terminals of the high-side transistors HQ is denoted as a protruding electrode 26b, the plate-like protruding electrode 26 connected to the source terminals of the high-side transistors HQ and the drain terminals of the low-side transistors LQ is denoted as a protruding electrode 26c, and the plate-like protruding electrode 26 connected to the source terminals of the low-side transistors LQ is denoted as a protruding electrode 26d.

Next, the operation of this embodiment is described.

Figure 7:
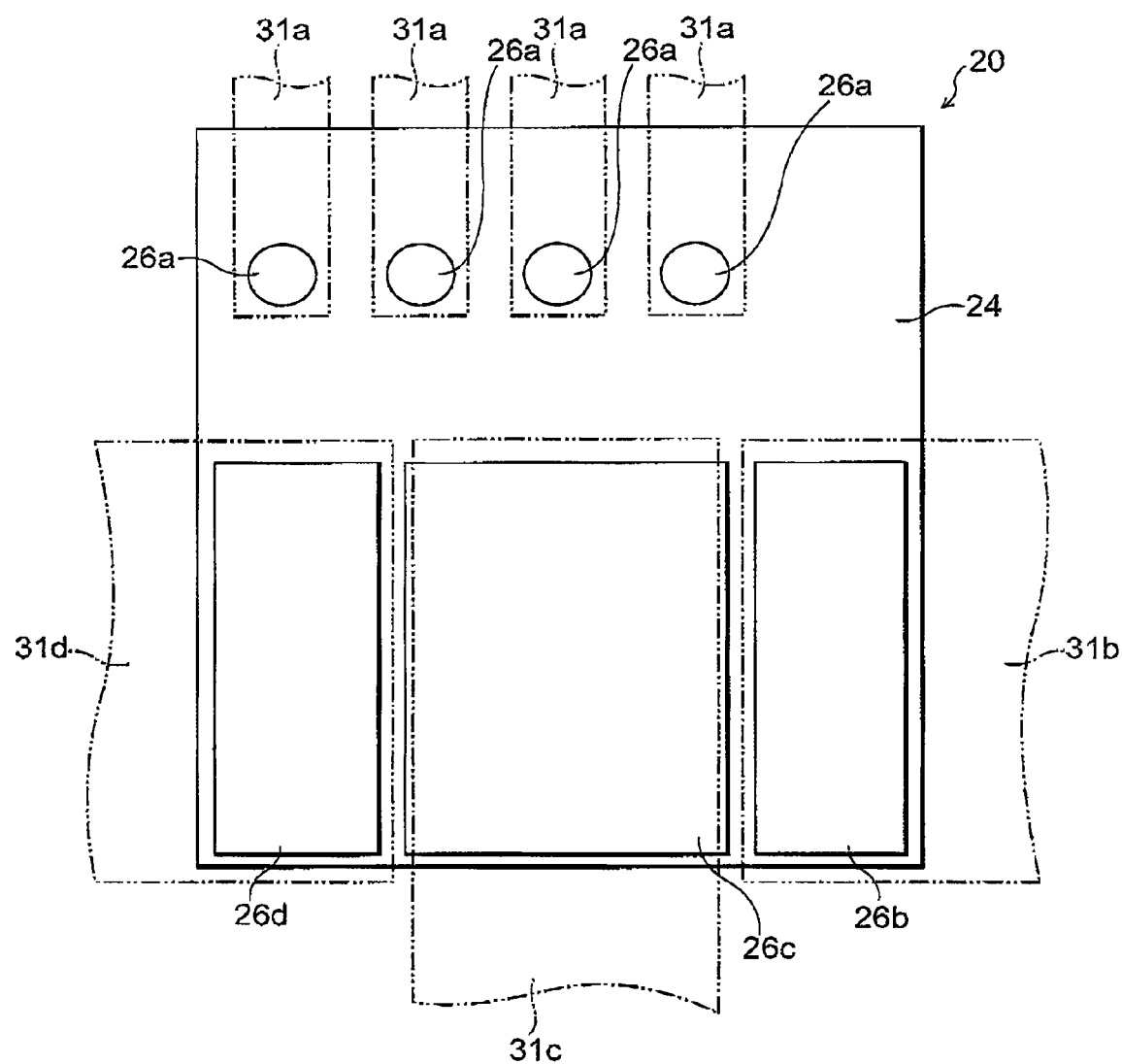
FIG. 7 is a plan view illustrating a method for connecting the semiconductor device according to the first embodiment.

FIG. 7 is a plan view illustrating a method for connecting the semiconductor device according to this embodiment.

As shown in FIG. 7, when the semiconductor chip 20 is incorporated in the DC-DC converter 1, the protruding electrodes 26 of the semiconductor chip 20 are brought into abutment with respective wirings printed on the printed circuit board, and the semiconductor chip 20 is mounted on the printed circuit board by reflow. Thus, the protruding electrodes 26 of the semiconductor chip 20 are connected to the respective wirings printed on the printed circuit board.

More specifically, the protruding electrode 26a is connected to a wiring 31a, through which a control signal flows, of the wirings printed on the printed circuit board. Thus, through the protruding electrode 26a and the wiring 31a, a control signal is inputted from the outside of the semiconductor chip 20 to the control circuit 12 and outputted from the control circuit 12 to the outside of the semiconductor chip 20. Furthermore, the protruding electrode 26b is connected to a wiring 31b to which the input potential $V_{in}$ is applied. Moreover, the protruding electrode 26c is connected to a wiring 31c which is connected to the inductor 13 (see FIG. 1). Furthermore, the protruding electrode 26d is connected to a wiring 31d to which the ground potential GND is applied. The wiring 31a has a narrower width than the wirings 31b, 31c, 31d. The wirings 31a-31d are extracted from the semiconductor chip 20 illustratively in orthogonal directions. The control signal flowing through the wiring 31a is a lower current than the power supply current flowing through the wirings 31b, 31c, 31d The input potential $V_{in}$ applied to the wiring 31b is passed through the plate-like protruding electrode 26b, the plate-like columnar electrode 25, and the sheet-like extraction wiring 23 to the multilayer wiring layer 22, propagated in the multilayer wiring layer 22, and passed to the drains of the high-side transistors HQ. The ground potential GND applied to the wiring 31d is passed through the plate-like protruding electrode 26d, the plate-like columnar electrode 25, and the sheet-like extraction wiring 23 to the multilayer wiring layer 22, propagated in the multilayer wiring layer 22, and passed to the sources of the low-side transistors LQ.

On the other hand, the control signal applied to the wiring 31a is passed through the protruding electrode 26a which was shaped like a hemisphere before bonding, the cylindrical columnar electrode 25, and the linear extraction wiring 23 to the multilayer wiring layer 22, propagated in the multilayer wiring layer 22, and passed to the terminals of the control circuit 12. Thus, the control circuit 12 outputs control signals having opposite polarities to the gates of the high-side transistors HQ and the gates of the low-side transistors LQ, and alternately brings into conduction the high-side transistors HQ and the low-side transistors LQ. Consequently, the potential $V_{SW}$ at the junction N provides a rectangular wave oscillating between the ground potential GND and the input potential $V_{in}$. Thus, the output circuit 11 outputs rectangular voltage pulses from the junction N.

These voltage pulses are passed through the plate-like columnar electrode 25 and the plate-like protruding electrode 26c to the wiring 31c and outputted to the inductor 13. Then, the LC circuit composed of the inductor 13 and the capacitor 14 smoothes these voltage pulses into a DC current and outputs it from the output terminal 15. Here, the potential $V_{out}$ of the DC current outputted from the output terminal 15 can be controlled by adjusting the ratio of the time period in which the high-side transistor HQ is brought into conduction by the control circuit 12 to the time period in which the low-side transistor LQ is brought into conduction.

Next, the effect of this embodiment is described.

In this embodiment, because the semiconductor chip 20 includes the extraction wirings 23, the protruding electrodes 26 can be placed at any positions irrespective of the configuration of the multilayer wiring layer 22. More specifically, the layout of the third source wirings $W_{3S}$, the third drain wirings $W_{3D}$, and the third control wirings $W_{3C}$ serving as the uppermost wirings of the multilayer wiring layer 22 can be determined independently of the layout of the protruding electrodes 26 serving as the external connection terminals of the semiconductor chip 20. This allows placement of the protruding electrodes 26 in accordance with the wiring layout of the printed circuit board while increasing the density of wirings in the multilayer wiring layer 22 so as to decrease wiring resistance. Consequently, the wiring resistance of the semiconductor chip 20 can be reduced.

In particular, in this embodiment, a plurality of third drain wirings $W_{3D}$ connected to the drains of the high-side transistors HQ are commonly connected to a single protruding electrode 26b, both a plurality of third source wirings $W_{3S}$ connected to the sources of the high-side transistors HQ and a plurality of third drain wirings $W_{3D}$ connected to the drains of the low-side transistors LQ are commonly connected to a single protruding electrode 26c, and a plurality of third source wirings $W_{3S}$ connected to the sources of the low-side transistors LQ are commonly connected to a single protruding electrode 26d. Thus, they can be connected to the wirings 31b, 31c, 31d of the printed circuit board through very large areas.

In FIG. 2 as illustrated, the plate-like columnar electrode 25 and the protruding electrode 26 are provided immediately above the uppermost wiring of the multilayer wiring layer 22. However, this embodiment is not limited thereto, but they can be provided at any positions in accordance with the wiring layout of the printed circuit board. Likewise, the cylindrical columnar electrodes 25 and the protruding electrodes 26a are illustratively arranged in a line in FIG. 2. However, this embodiment is not limited thereto, but they can be placed at any positions through the intermediary of the extraction wirings 23.

Furthermore, in this embodiment, the protrusion electrodes 26b, 26c, 26d, through which a current larger than the control signal flows, and the columnar electrodes 25 connected thereto are shaped like a plate, and the extraction wirings 23 to which they are connected are shaped like a sheet, so that the vertical wiring resistance in the protrusion electrodes 26, the columnar electrodes 25, and the extraction wirings 23 can be reduced. Furthermore, because the thick wirings 31b, 31c, 31d can be connected to the plate-like protrusion electrodes 26b, 26c, 26d, the wiring resistance of the printed circuit board can also be reduced. In particular, it is conventionally difficult to connect a thick wiring to an electrode corresponding to the junction N. However, according to this embodiment, the protruding electrode 26c can be formed with a large area overlapping the high-side region $R_H$ and the low-side region $R_L$. Thus, the width of the wiring 31c can be expanded to reduce wiring resistance without increasing ineffective area.

Furthermore, according to this embodiment, the thickness of the columnar electrode 25 is as large as e.g. 70 to 80 microns so that the horizontal wiring resistance can also be reduced. Furthermore, the columnar electrode 25 and the sealing resin layer 24, which are formed thick, can relax thermal stress due to the difference in thermal expansion coefficient between the printed circuit board and the silicon substrate 21, and hence improve the reliability of the DC-DC converter 1.

It is noted that a slit may be formed in the plate-like protrusion electrodes 26b, 26c, 26d and the plate-like columnar electrodes 25 connected thereto. This can improve the aforementioned effect of relaxing thermal stress. This slit is formed preferably along the current flow direction so as to avoid increasing wiring resistance.

Figure 8:
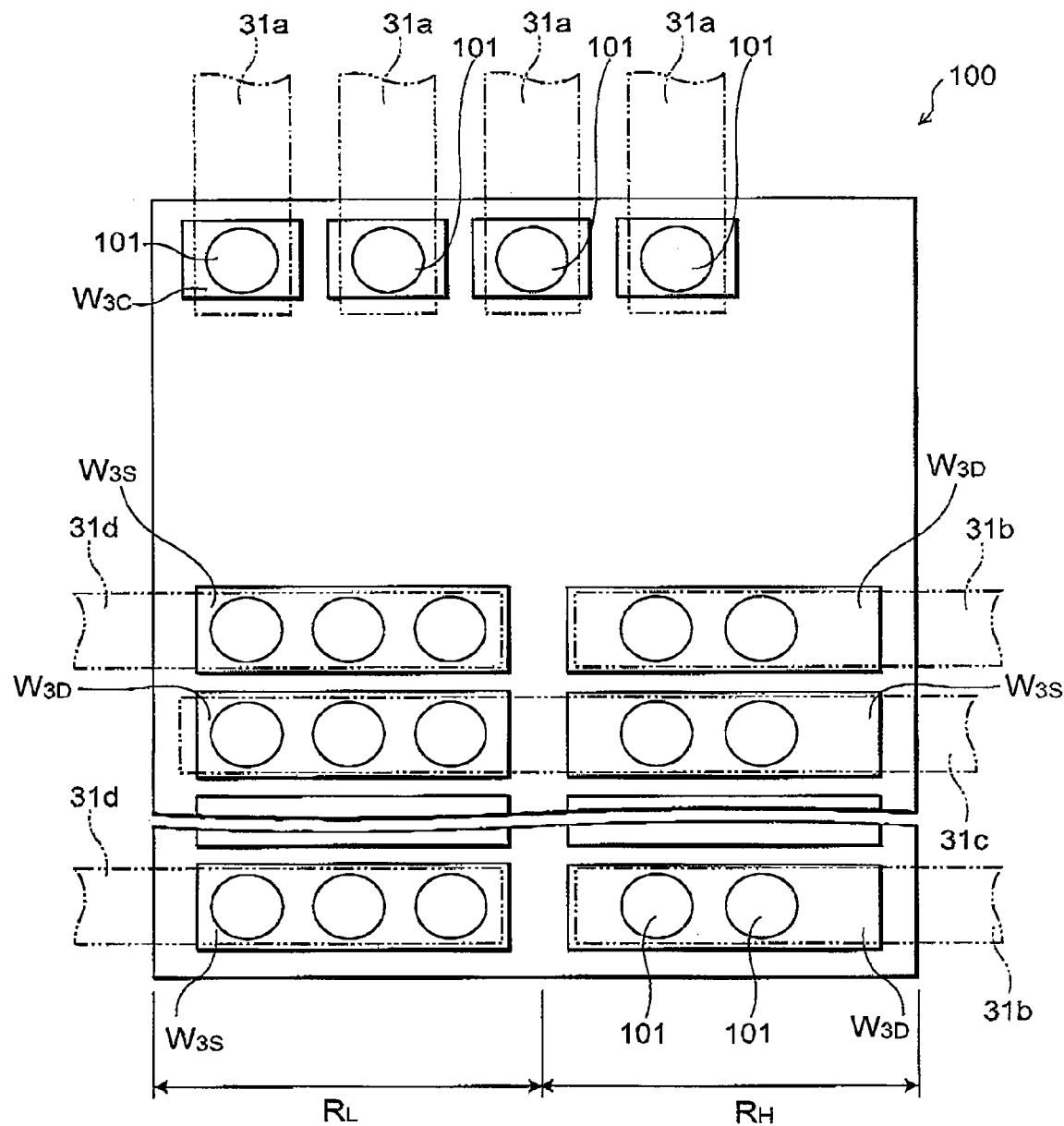
FIG. 8 is a plan view illustrating a semiconductor chip of a comparative example of the first embodiment.

Next, a comparative example of this embodiment is described,

FIG. 8 is a plan view illustrating a semiconductor chip of this comparative example.

As shown in FIG. 8, the wiring layout of the third wiring layer in the semiconductor chip 100 of this comparative example is similar to that of the above first embodiment. More specifically, in each of the high-side region $R_H$ and the low-side region $R_L$, third source wirings $W_{3S}$ and third drain wirings $W_{3D}$ are provided alternately and parallel to each other. However, this comparative example does not include the extraction wirings 23, the sealing resin layer 24, the columnar electrodes 25, and the protruding electrodes 26 (see FIG. 6 for them all), but includes, instead, solder bumps 101 on the third-layer wiring. The wirings 31a-31d of the printed circuit board are connected to the third-layer wiring through the solder bumps 101.

In this case, as shown in FIG. 8, the layout of the wirings 31a-31d of the printed circuit board needs to be matched with the layout of the third source wirings $W_{3S}$ and the third drain wirings $W_{3D}$. Hence, as compared with the above first embodiment, the layout of the wirings 31a-31d is downscaled. Conversely, in the case where the wiring layout of the printed circuit board is constrained, the wiring layout of the third-layer wiring of the semiconductor chip 100 is also constrained. For example, in the case where the wiring spacing of the printed circuit board is 500 microns or more, the wiring spacing of the third source wirings $W_{3S}$ and the third drain wirings $W_{3D}$ also needs to be 500 microns or more, and cannot be downscaled any further.

For example, as shown in FIG. 3, as viewed from above, the third source wiring $W_{3S}$ intersects the second drain wiring $W_{2D}$, and part of the second drain wiring $W_{2D}$ is located immediately below the third source wiring $W_{3S}$. In the current path from the portion of the second drain wiring $W_{2D}$ located immediately below the third source wiring $W_{3S}$ to the third drain wiring $W_{3D}$, the current path extends horizontally to the portion of the second drain wiring $W_{2D}$ located immediately below the third drain wiring $W_{3D}$. Hence, if the wiring spacing of the third source wirings $W_{3S}$ and the third drain wirings $W_{3D}$ is 500 microns or more, the horizontally extending length of the current path is also 500 microns or more, and increases the wiring resistance. Hence, in this comparative example, the wiring resistance cannot be sufficiently reduced.

Next, a second embodiment of the invention is described.

Figure 9:
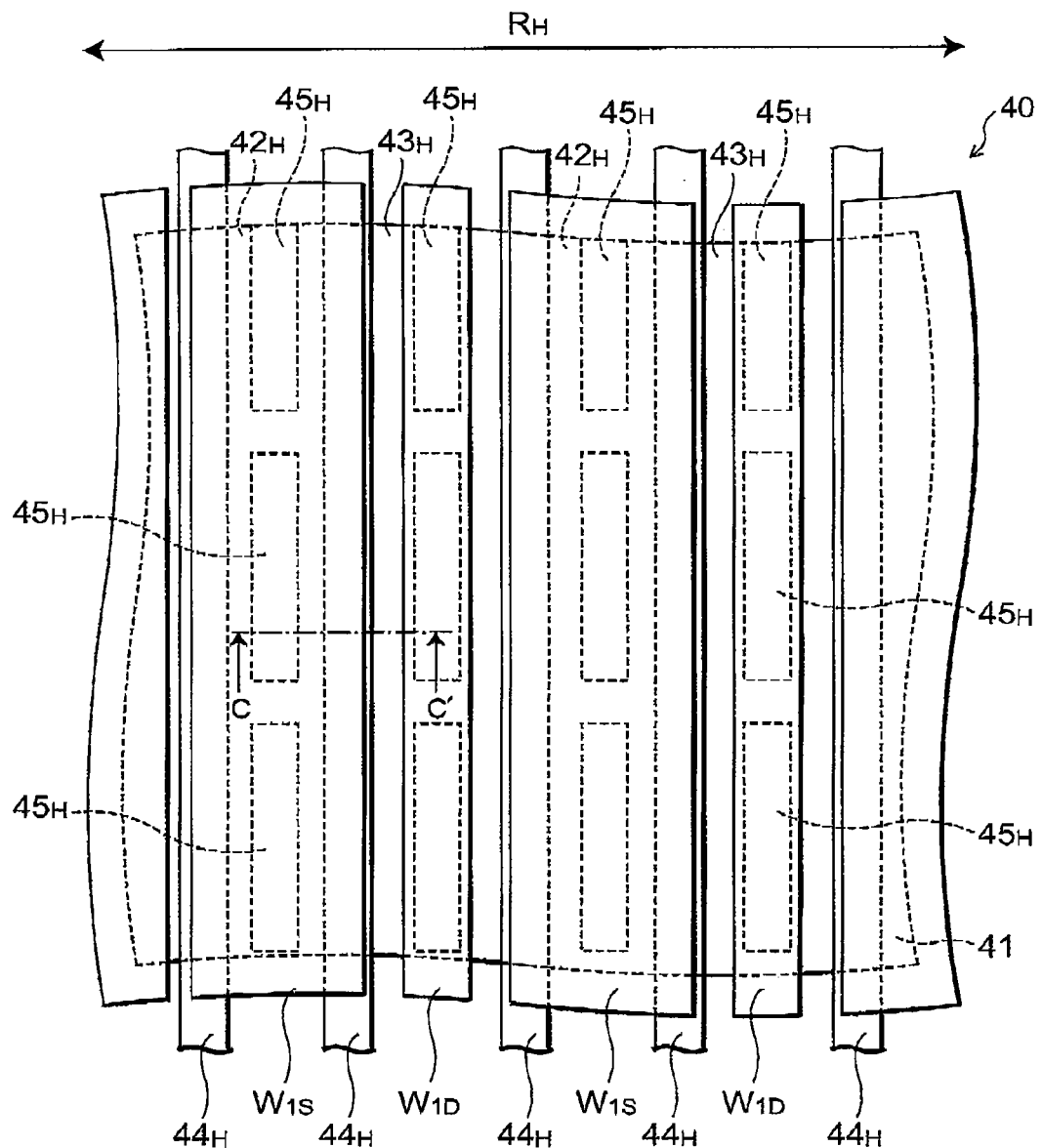
FIG. 9 is a plan view illustrating a high-side transistor in a second embodiment of the invention.

FIG. 9 is a plan view illustrating a high-side transistor in this embodiment.

Figure 10:
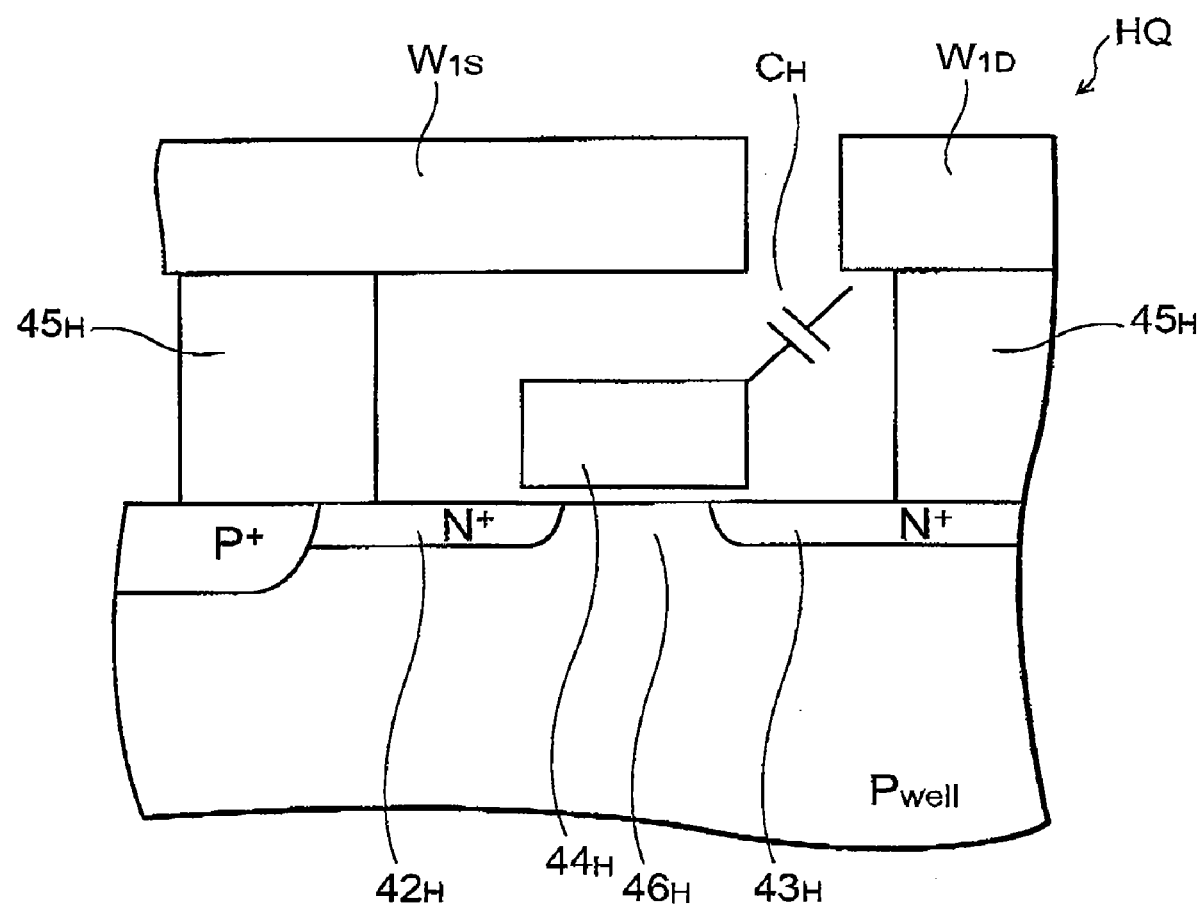
FIG. 10 is a cross-sectional view taken along line C-C' shown in FIG. 9.

FIG. 10 is a cross-sectional view taken along line C-C' shown in FIG. 9.

Figure 11:
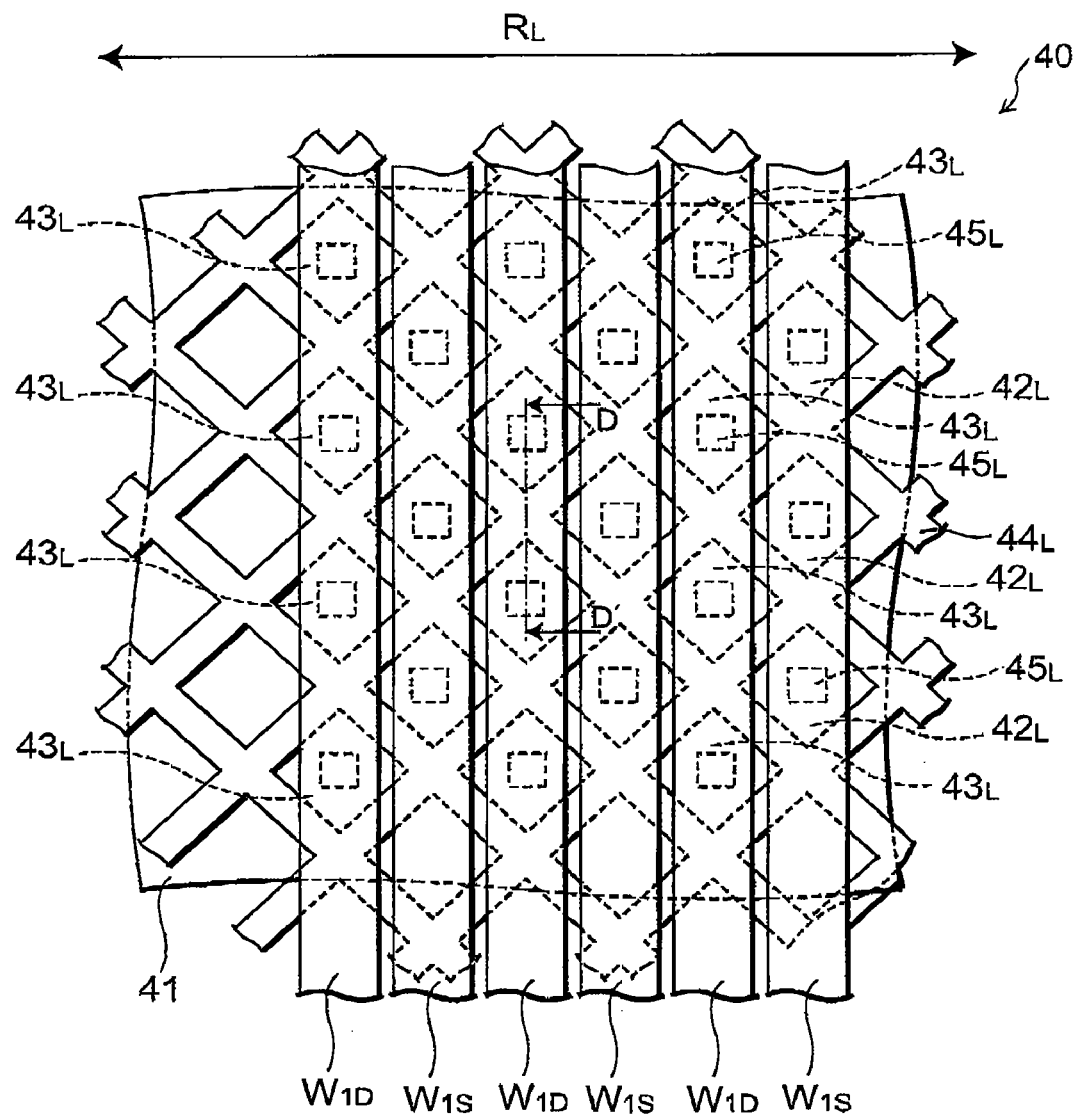
FIG. 11 is a plan view illustrating a low-side transistor in the second embodiment.

FIG. 11 is a plan view illustrating a low-side transistor in this embodiment.

Figure 12:
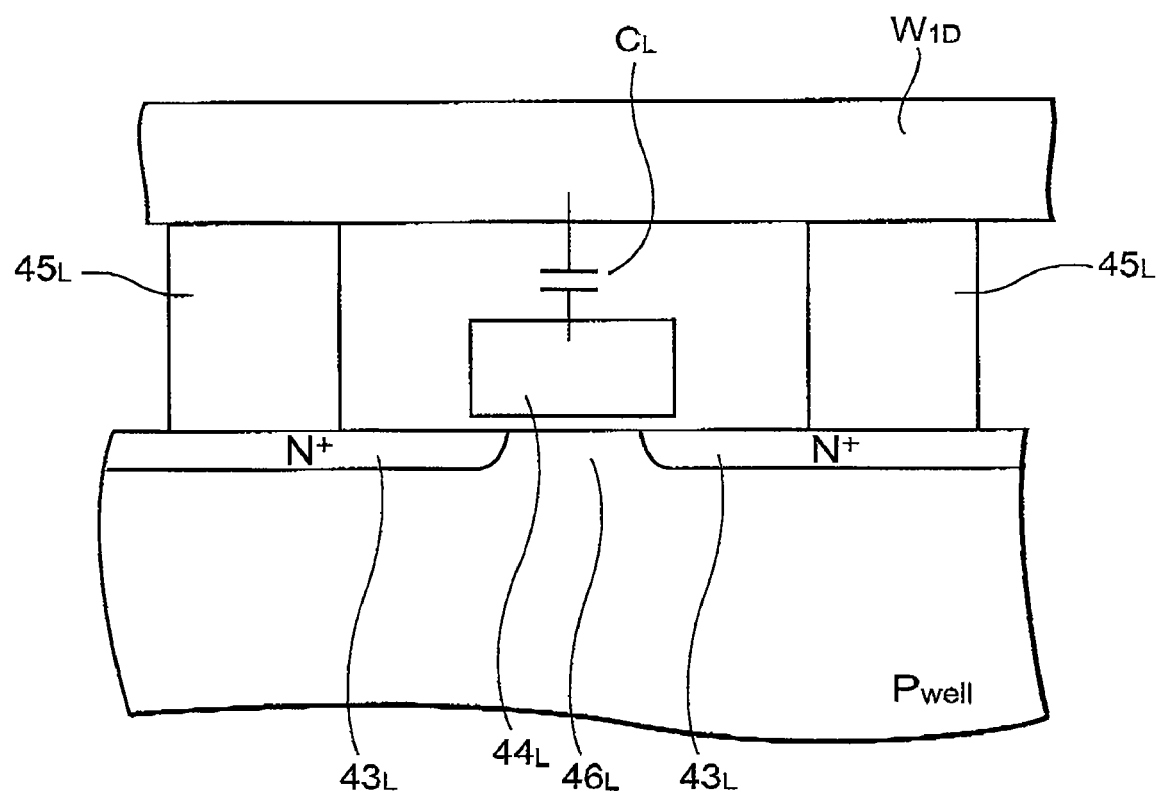
FIG. 12 is a cross-sectional view taken along line D-D' shown in FIG. 1.

FIG. 12 is a cross-sectional view taken along line D-D' shown in FIG. 11.

In FIGS. 10 and 12, for clarity of illustration, dielectric films are not shown.

As shown in FIGS. 9 to 12, in the semiconductor chip 40 of a DC-DC converter according to this embodiment, the high-side transistor HQ and the low-side transistor LQ are different in device structure from each other. Accordingly, the wiring structure of the first wiring layer $L_1$ of the multilayer wiring layer is also different between the high-side region $R_H$ and the low-side region $R_L$. The configuration of the multilayer wiring layer above the second wiring layer in the semiconductor chip 40 and the configuration of the DC-DC converter according to this embodiment in the portion other than the semiconductor chip 40 are the same as those of the above first embodiment.

As shown in FIGS. 9 and 10, in the high-side region $R_H$, in an upper portion of a silicon substrate 41, source regions $42_H$ and drain regions $43_H$ of high-side transistors HQ are formed alternately and parallel to each other in a striped configuration. The striped region between the source region $42_H$ and the drain region $43_H$ constitutes a channel region $46_H$, and a gate electrode $44_H$ shaped like a stripe is provided immediately above the channel region $46_H$ through the intermediary of a gate dielectric film (not shown).

Furthermore, a first source wiring $W_{1S}$ shaped like a stripe is provided in a region including the immediately overlying region of the source region $42_H$, and a first drain wiring $W_{1D}$ shaped like a stripe is provided in part of the immediately overlying region of the drain region $43_H$. That is, in the first wiring layer $L_1$, the first source wirings $W_{1S}$ and the first drain wirings $W_{1D}$ are provided alternately and parallel to each other. The first source wiring $W_{1S}$ and the first drain wiring $W_{1D}$ are connected to the source region $42_H$ and the drain region $43_H$, respectively, through contacts $45_H$. However, the first source wiring $W_{1S}$ has a larger width than the first drain wiring $W_{1D}$, and both widthwise end portions of the first source wiring $W_{1S}$ extend out to the immediately overlying region of the gate electrode $44_H$. On the other hand, the first drain wiring $W_{1D}$ is placed outside the immediately overlying region of the gate electrode $44_H$.

In contrast, as shown in FIGS. 11 and 12, in the low-side region $R_L$, in the upper portion of the silicon substrate 41, source regions $42_L$ and drain regions $43_L$ of low-side transistors LQ are arranged in a matrix configuration. The source regions $42_L$ and the drain regions $43_L$ each have a rectangular shape and are arranged in a checkerboard pattern. That is, the source regions $42_L$ and the drain regions $43_L$ are alternately arranged along two orthogonal directions in which the outer periphery of each region extends. The lattice-like region between the source regions $42_L$ and the drain regions $43_L$ constitutes a channel region $46_L$, and a gate electrode $44_L$ shaped like a lattice is provided immediately above the channel region $46_L$ through the intermediary of a gate dielectric film (not shown).

Furthermore, first source wirings $W_{1S}$ in a striped configuration and first drain wirings $W_{1D}$ in a striped configuration are provided alternately and parallel to each other along one of the directions inclined at 45 degrees with respect to both the two extending directions of the outer periphery of each region, that is, along the arranging direction of only either the source regions $42_L$ or the drain regions $43_L$. The first source wiring $W_{1S}$ extends linearly so as to interconnect the immediately overlying regions of the center portions of the source regions $42_L$, and the first drain wiring $W_{1D}$ extends linearly so as to interconnect the immediately overlying regions of the center portions of the drain regions $43_L$. The first source wiring $W_{1S}$ and the first drain wiring $W_{1D}$ are connected, respectively, to the center portion of the source region $42_L$ and the center portion of the drain region $43_L$ through contacts $45_L$. It is noted that the width of the first source wiring $W_{1S}$ is illustratively equal to the width of the first drain wiring $W_{1D}$.

Next, the operation of this embodiment is described.

As shown in FIGS. 9 and 10, in the high-side region $R_H$, the first drain wiring $W_{1D}$ is placed outside the immediately overlying region of the gate electrode $44_H$. This serves to increase the distance between the first drain wiring $W_{1D}$ and the gate electrode $44_H$ and reduce the gate-drain parasitic capacitance $C_H$ in the high-side transistor HQ.

On the other hand, as shown in FIGS. 11 and 12, in the low-side region $R_L$, the first drain wiring $W_{1D}$ is placed also immediately above the gate electrode $44_L$. Hence, the gate-drain parasitic capacitance $C_L$ is higher in the low-side transistor LQ than in the high-side transistor HQ.

However, in the low-side transistors LQ, the source regions $42_L$ and the drain regions $43_L$ are arranged in a checkerboard pattern, and the gate electrode $44_L$ is placed throughout the region of the silicon substrate 41 between the source regions $42_L$ and the drain regions $43_L$, that is, the immediately overlying region of the lattice-like region. Hence, the lattice-like region entirely functions as a channel region $46_L$. Thus, the low-side transistor LQ has a larger gate width, a higher channel density, and hence a lower on-resistance, than the high-side transistor HQ.

Thus, in this embodiment, the high-side transistor HQ is different in configuration from the low-side transistor LQ as described above. Hence, the high-side transistor HQ has a lower gate-drain parasitic capacitance than the low-side transistor LQ, and the low-side transistor LQ has a lower on-resistance than the high-side transistor HQ.

Next, the effect of this embodiment is described.

As the input potential $V_{out}$ comes close to the ground potential GND rather than to the input potential $V_{in}$ with the increase of the stepdown ratio of the DC-DC converter, the time period in which the current backflows through the low-side transistor LQ becomes longer than the time period in which the current flows through the high-side transistor HQ. Hence, to reduce the overall on-resistance of the DC-DC converter, the low-side transistor LQ is required to have a lower on-resistance than the high-side transistor HQ.

Furthermore, no switching loss occurs in the low-side transistor LQ because of its zero-volt switching. Hence, in the low-side transistor LQ, the channel resistance accounts for a large proportion in the on-resistance. This trend is noticeable particularly in transistors having low breakdown voltage. Thus, in this embodiment, the gate electrode is shaped in a lattice-like layout to increase the channel density and reduce the resistance on the silicon substrate 41 side. This also serves to decrease the area of the low-side transistor LQ and reduce the routing resistance of wirings.

On the other hand, a switching loss occurs in the high-side transistor HQ because it does not operate under zero-volt switching. Furthermore, as the gate-drain parasitic capacitance $C_H$ increases, the voltage change at switching time slows down, and the switching loss increases. Hence, in the high-side transistor HQ, reduction of gate-drain parasitic capacitance is also required.

Thus, in this embodiment, as described above, priority is given to the reduction of gate-drain parasitic capacitance in the high-side transistor HQ and to the reduction of on-resistance in the low-side transistor LQ so that the voltage conversion efficiency of the DC-DC converter as a whole can be further increased. The operation and effect of this embodiment other than the foregoing are the same as those of the above first embodiment.

Next, a third embodiment of the invention is described.

Figure 13:
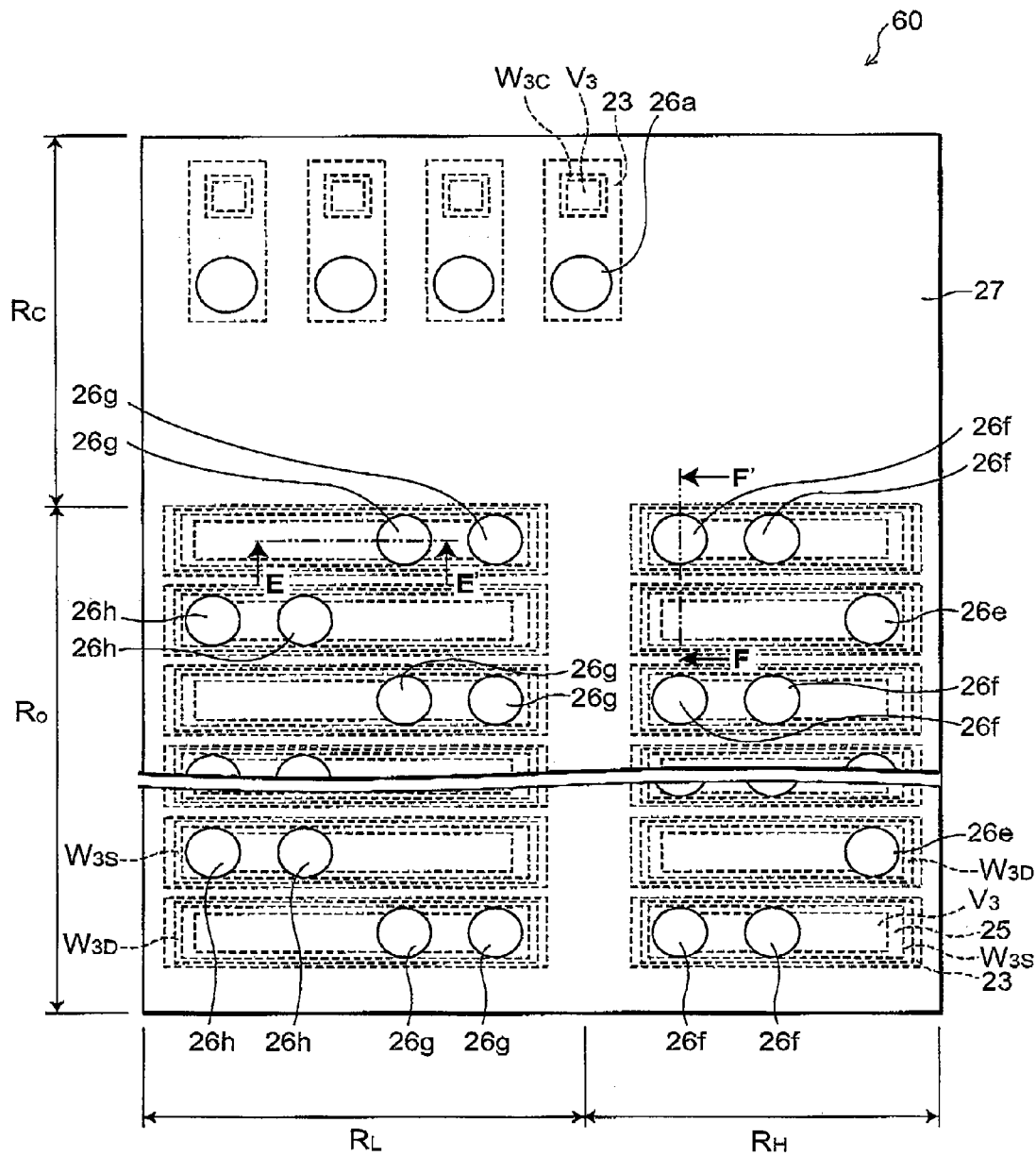
FIG. 13 is a plan view illustrating the uppermost layer of a semiconductor chip of the semiconductor device according to a third embodiment of the invention.

FIG. 13 is a plan view illustrating the uppermost layer of a semiconductor chip of the semiconductor device according to this embodiment.

Figure 14:
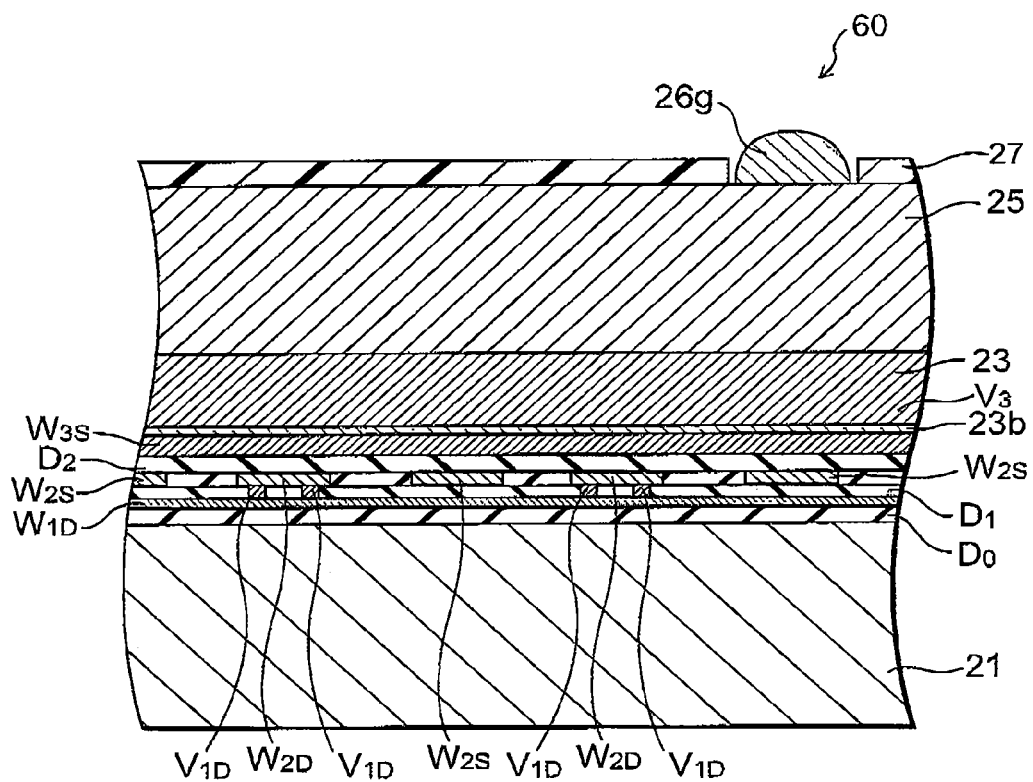
FIG. 14 is a cross-sectional view taken along line E-E' shown in FIG. 13.

FIG. 14 is a cross-sectional view taken along line E-E' shown in FIG. 13.

Figure 15:
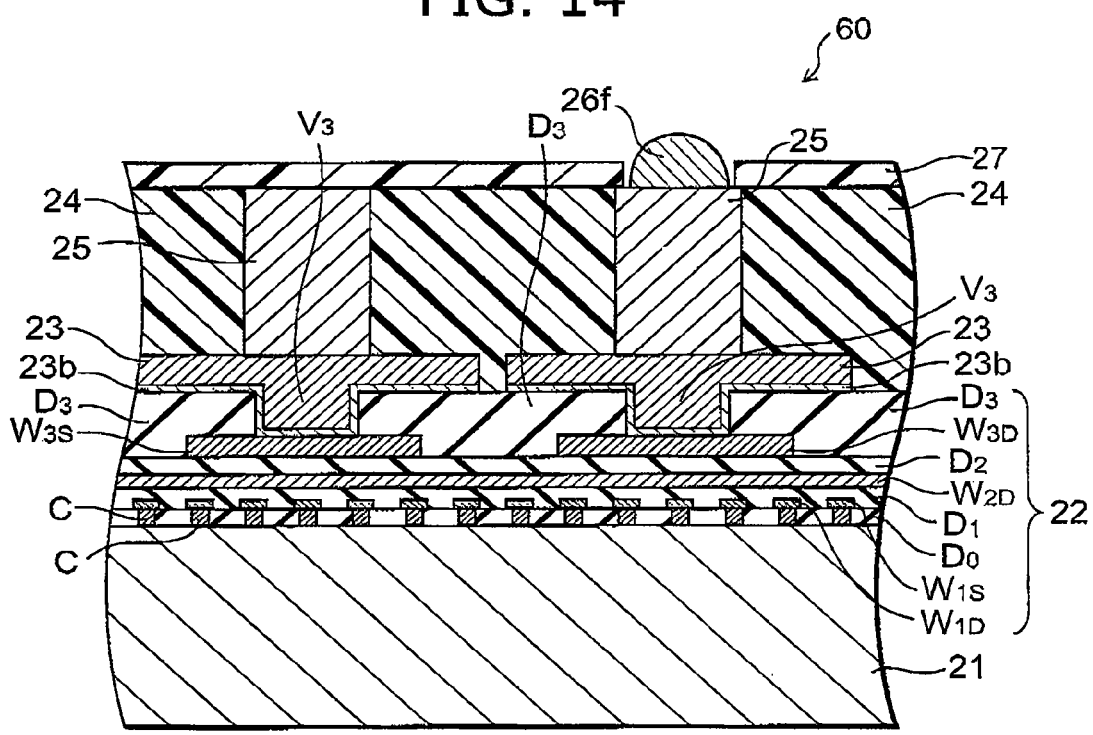
FIG. 15 is a cross-sectional view taken along line F-F' shown in FIG. 13.

FIG. 15 is a cross-sectional view taken along line F-F' shown in FIG. 13.

As shown in FIGS. 13 to 15, the semiconductor chip 60 according to this embodiment is different from the semiconductor chip 20 according to the above first embodiment (see FIG. 2) in the configuration of the upper portion of the output circuit region $R_O$ above the vias $V_3$. More specifically, in the output circuit region $R_O$ of the semiconductor chip 60, the via $V_3$ is formed in the region other than the peripheral portion of the immediately overlying region of the uppermost wirings, that is, the third source wirings $W_{3S}$ and the third drain wirings $W_{3D}$, in both the high-side region $R_H$ and the low-side region $R_L$. Hence, as viewed from above, the via $V_3$ formed in the output circuit region $R_O$ is shaped like a strip, which is approximate to the shape of the uppermost wiring.

Furthermore, an extraction wiring 23, which is slightly larger than the uppermost wiring as viewed from above, is provided immediately above the via $V_3$. Moreover, a columnar electrode 25, which is slightly smaller than the uppermost wiring and slightly larger than the via $V_3$, is provided immediately above the extraction wiring 23. As viewed from above, the columnar electrode 25 is shaped like a strip. Hence, as viewed from above, the outer periphery of the extraction wiring 23, the outer periphery of the uppermost wiring, the outer periphery of the columnar electrode 25, and the outer periphery of the via $V_3$ are all concentric rectangles located in this order from outside. The upper surface of the columnar electrode 25 is located at the same height as the upper surface of the sealing resin layer 24, and a solder resist film 27 made of a resin material is provided on the sealing resin layer 24. The solder resist film 27 covers part of the upper surface of the columnar electrode 25.

Openings are formed in part of the region of the solder resist film 27 immediately above the columnar electrodes 25, and protruding electrodes 26e to 26h are provided in the openings. The shape and size of the protruding electrodes 26e to 26h are generally the same as the shape and size of the protruding electrode 26a provided in the control circuit region $R_C$, and are shaped like part of a sphere, such as a hemisphere. By way of example, one protruding electrode 26e is provided on each third drain wiring $W_{3D}$ of the high-side region $R_H$, two protruding electrodes 26f are provided on each third source wiring $W_{3S}$ of the high-side region $R_H$, two protruding electrode 26g are provided on each third drain wiring $W_{3D}$ of the low-side region $R_L$, and two protruding electrodes 26h are provided on each third source wiring $W_{3S}$ of the low-side region $R_L$. In the direction from the high-side region $R_H$ to the low-side region $R_L$, the protruding electrodes 26e, 26f, 26g, 26h are displaced with respect to each other. The configuration of this embodiment other than the foregoing is the same as that of the above first embodiment.

Next, the operation of this embodiment is described.

Figure 16:
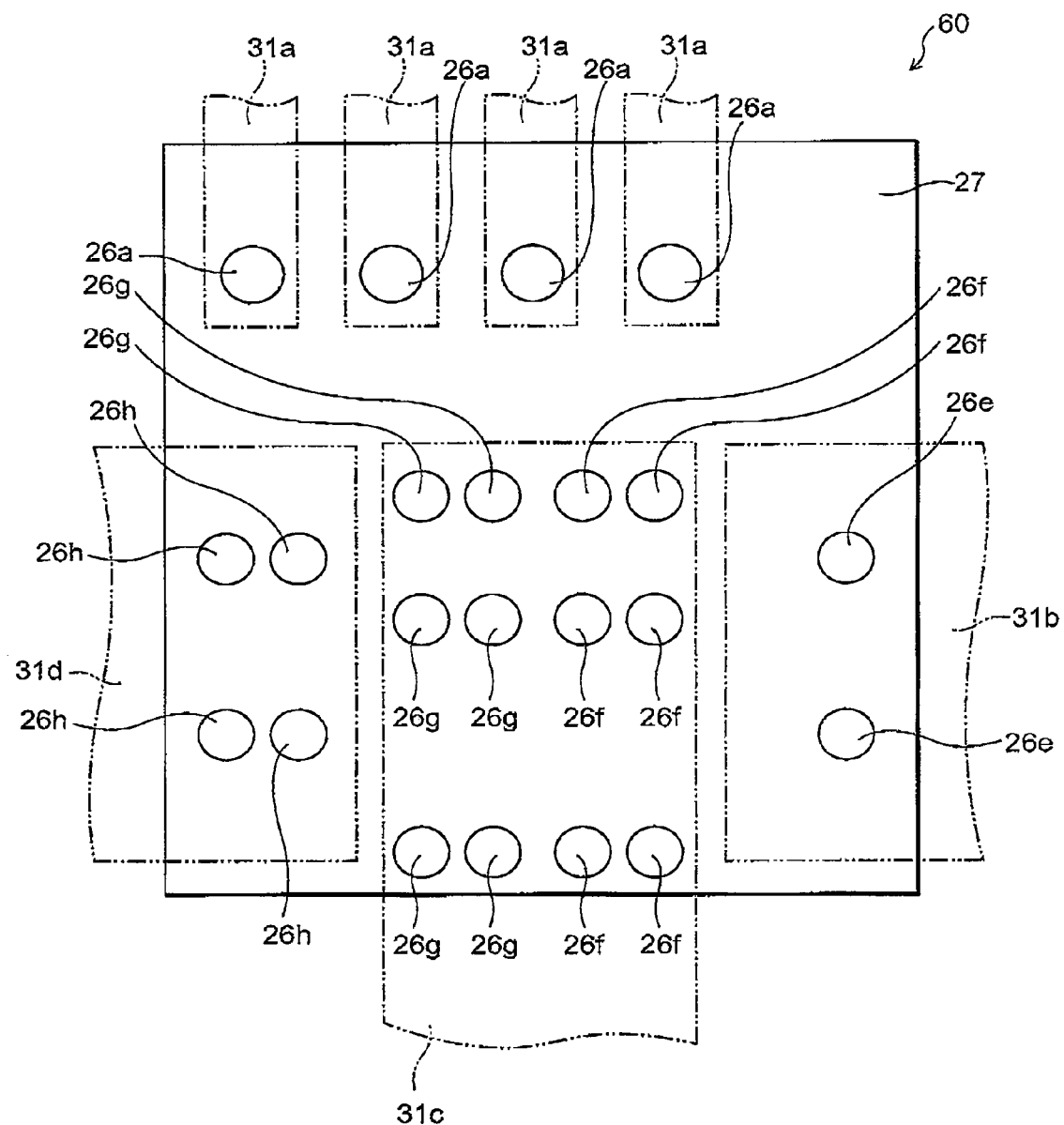
FIG. 16 is a plan view illustrating a method for connecting the semiconductor device according to the third embodiment.

FIG. 16 is a plan view illustrating a method for connecting the semiconductor device according to this embodiment.

As shown in FIG. 16, in this embodiment, wirings 31a, 31b, 31c, 31d are connected in a manner similar to that in the above first embodiment. Here, the wiring 31a is connected to the protruding electrode 26a, the wiring 31b is connected to the protruding electrode 26e, the wiring 31c is connected to the protruding electrodes 26f and 26g, and the wiring 31d is connected to the protruding electrode 26h.

Next, a method for manufacturing the semiconductor chip 60 in this embodiment is described.

FIGS. 17 to 21 are process cross-sectional views illustrating the method for manufacturing a semiconductor chip in this embodiment.

It is noted that FIGS. 17 to 21 show the same cross section as FIG. 15.

Figure 17:
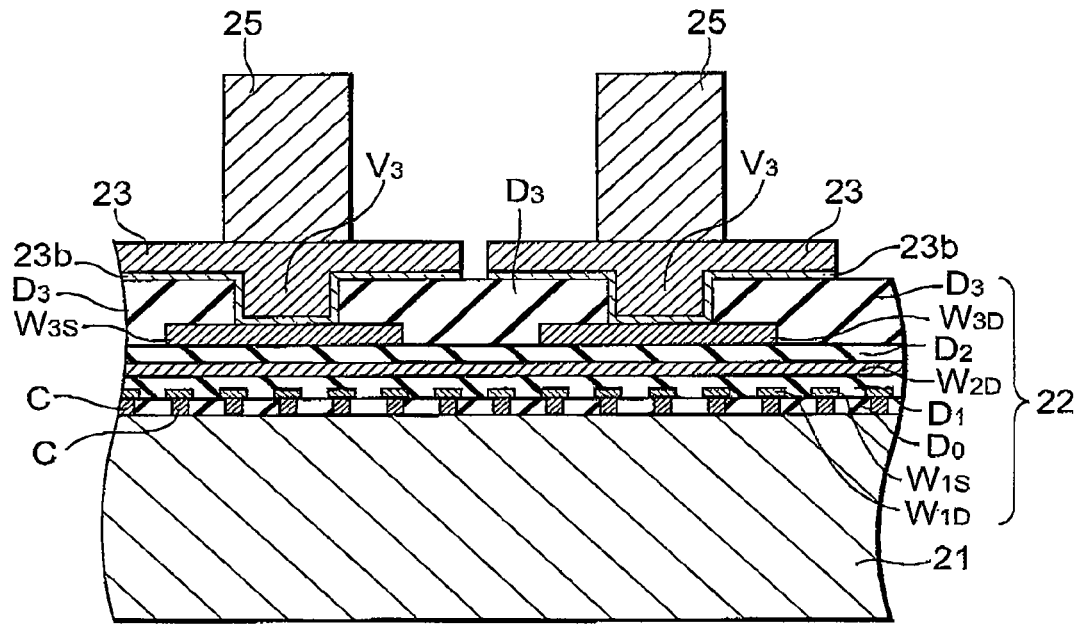
FIG. 17 is a process cross-sectional view illustrating the method for manufacturing a semiconductor chip in the third embodiment.

First, as shown in FIG. 17, a multilayer wiring layer 22 is formed on a silicon substrate 21. Here, vias $V_3$ are formed in the dielectric film $D_3$ of the third wiring layer $L_3$, and extraction wirings 23 are formed on the dielectric film $D_3$, so that they are connected to the uppermost wirings of the multilayer wiring layer 22. Subsequently, a columnar electrode 25 is formed on the extraction wiring 23.

Figure 18:
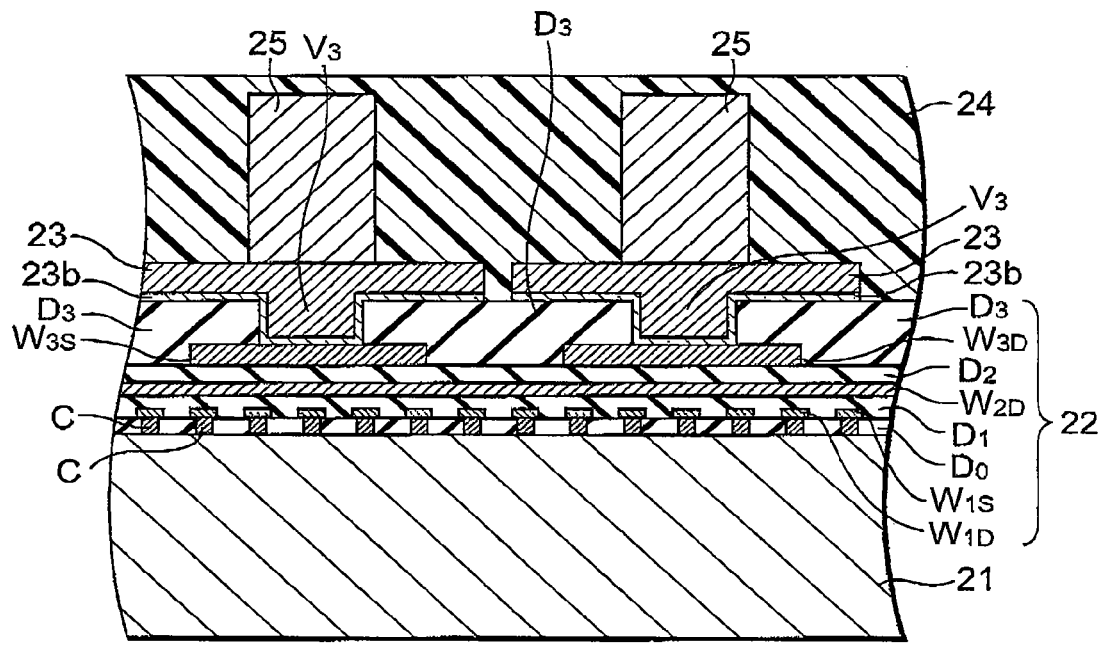
FIG. 18 is a process cross-sectional view illustrating the method for manufacturing a semiconductor chip in the third embodiment.

Next, as shown in FIG. 18, a sealing resin layer 24 is formed on the multilayer wiring layer 22 so as to cover the extraction wirings 23 and the columnar electrodes 25. Here, the thickness of the sealing resin layer 24 is set to be slightly larger than the height of the columnar electrode 25. Hence, in this state, the upper surface of the columnar electrode 25 is covered with the sealing resin layer 24.

Figure 19:
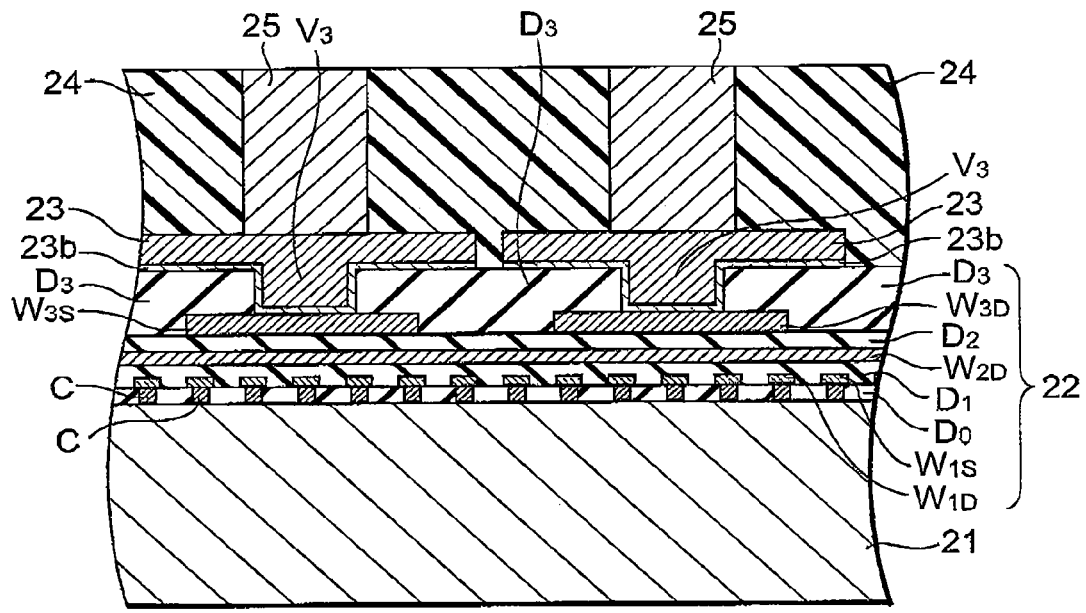
FIG. 19 is a process cross-sectional view illustrating the method for manufacturing a semiconductor chip in the third embodiment.

Next, as shown in FIG. 19, the upper surface of the sealing resin layer 24 is polished to achieve planarization and to expose the columnar electrodes 25. Thus, the upper surface of the sealing resin layer 24 is made coplanar with the upper surface of the columnar electrodes 25.

Figure 20:
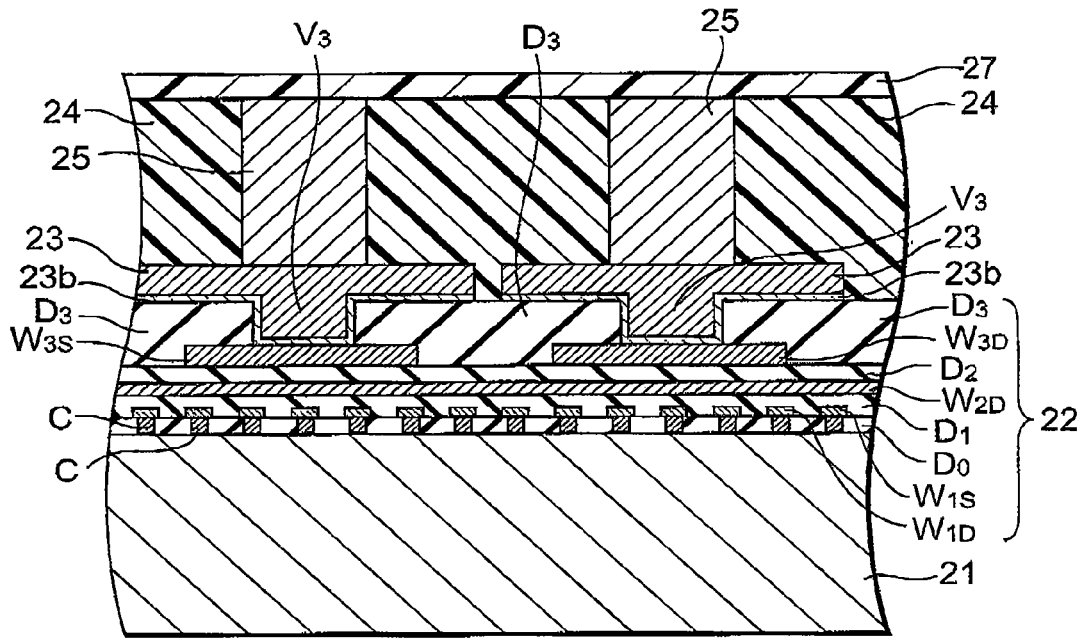
FIG. 20 is a process cross-sectional view illustrating the method for manufacturing a semiconductor chip in the third embodiment.
Figure 21:
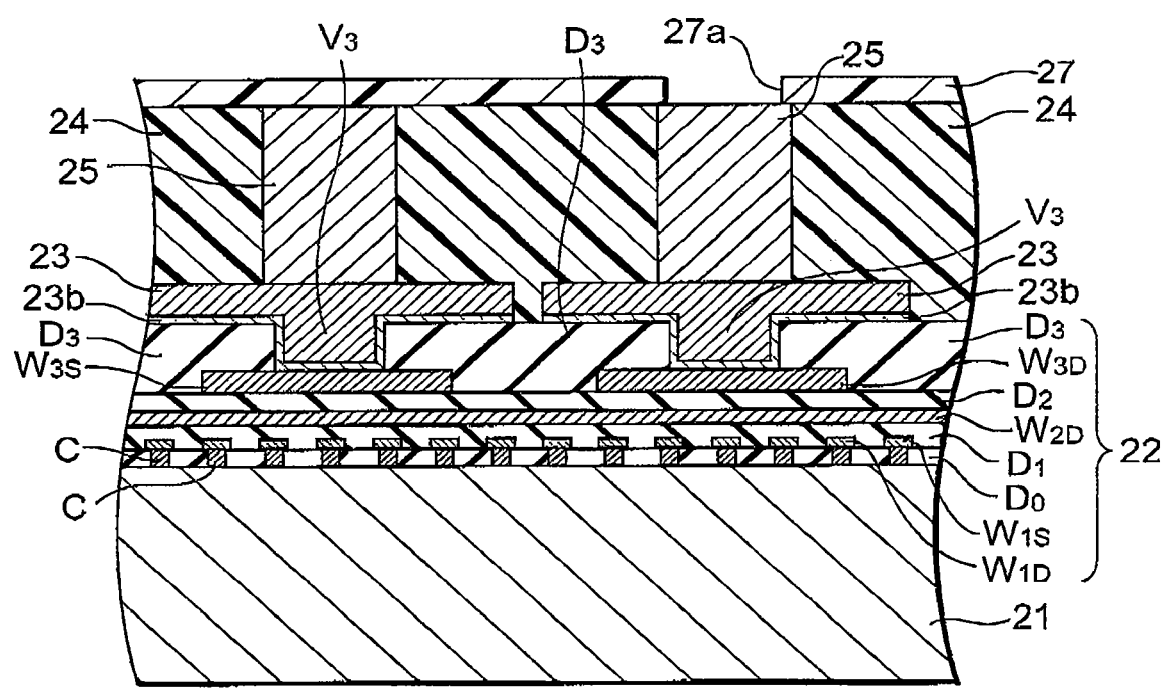
FIG. 21 is a process cross-sectional view illustrating the method for manufacturing a semiconductor chip in the third embodiment.

Next, as shown in FIG. 20, a solder resist film 27 is formed entirely on the upper surface of the sealing resin layer 24 and the columnar electrodes 25. Next, as shown in FIG. 21, an opening 27a is formed in the solder resist film 27 by removing a region immediately above the columnar electrode 25 where a protruding electrode 26 is to be formed.

Then, as shown in FIG. 15, a protruding electrode 26 is formed in the opening 27a (see FIG. 21) illustratively by solder printing. Here, all the protruding electrodes 26a, 26e, 26f, 26g, 26h are formed simultaneously and in the same shape.

Next, the effect of this embodiment is described.

If the shape of the protruding electrode 26a is significantly different from the shape of the protruding electrodes 26b, 26c, 26d as in the above first embodiment, the height of the protruding electrodes 26 may vary greatly when these protruding electrodes are formed by solder printing. Great variation in the height of the protruding electrodes may cause trouble in mounting the semiconductor chip 20 on a printed circuit board. Thus, care needs to be taken in forming the protruding electrodes by solder printing.

In contrast, in this embodiment, all the protruding electrodes 26 have the same shape and size. Hence, the height of the protruding electrodes 26 is less likely to vary even if the protruding electrodes 26 are formed by solder printing and the like. Consequently, trouble is less likely to occur in mounting the semiconductor chip 60 on a printed circuit board. That is, according to this embodiment, the protruding electrodes 26 are formed easily, and the mounting process has high reliability.

Furthermore, in this embodiment, part of the upper surface of the columnar electrode 25 is covered with the solder resist film 27. Thus, any region of the upper surface of the columnar electrode 25 can be exposed, and the protruding electrode 26 can be provided in this exposed region. Consequently, the position of placing the protruding electrode 26 can be arbitrarily selected, and the protruding electrode 26 can be prevented from being in contact with other columnar electrodes.

For example, in this embodiment, the positions of forming the protruding electrodes 26e, 26f, 26g, 26h are displaced with respect to each other in the direction from the high-side region $R_H$ to the low-side region $R_L$. Thus, as shown in FIG. 16, the output circuit region $R_O$ can be broadly divided into only the three regions, that is, the region connected to the wiring 31b, the region connected to the wiring 31c, and the region connected to the wiring 31d. Consequently, the arrangement spacing of the third source wirings $W_{3S}$ and the third drain wirings $W_{3D}$ can be determined independently of the wiring spacing of the printed circuit board. For example, even in the case where the wiring spacing of the printed circuit board is 500 microns or more, the wiring spacing of the third source wirings $W_{3S}$ and the third drain wirings $W_{3D}$ can be less than 500 microns.

Furthermore, in this embodiment, in the output circuit region $R_O$, as viewed from above, the columnar electrode 25 is shaped like a strip. Hence, like the above first embodiment, the resistance between the uppermost wiring and the protruding electrode can be reduced. The effect of this embodiment other than the foregoing is the same as that of the above first embodiment.

Next, a fourth embodiment of the invention is described.

Figure 22:
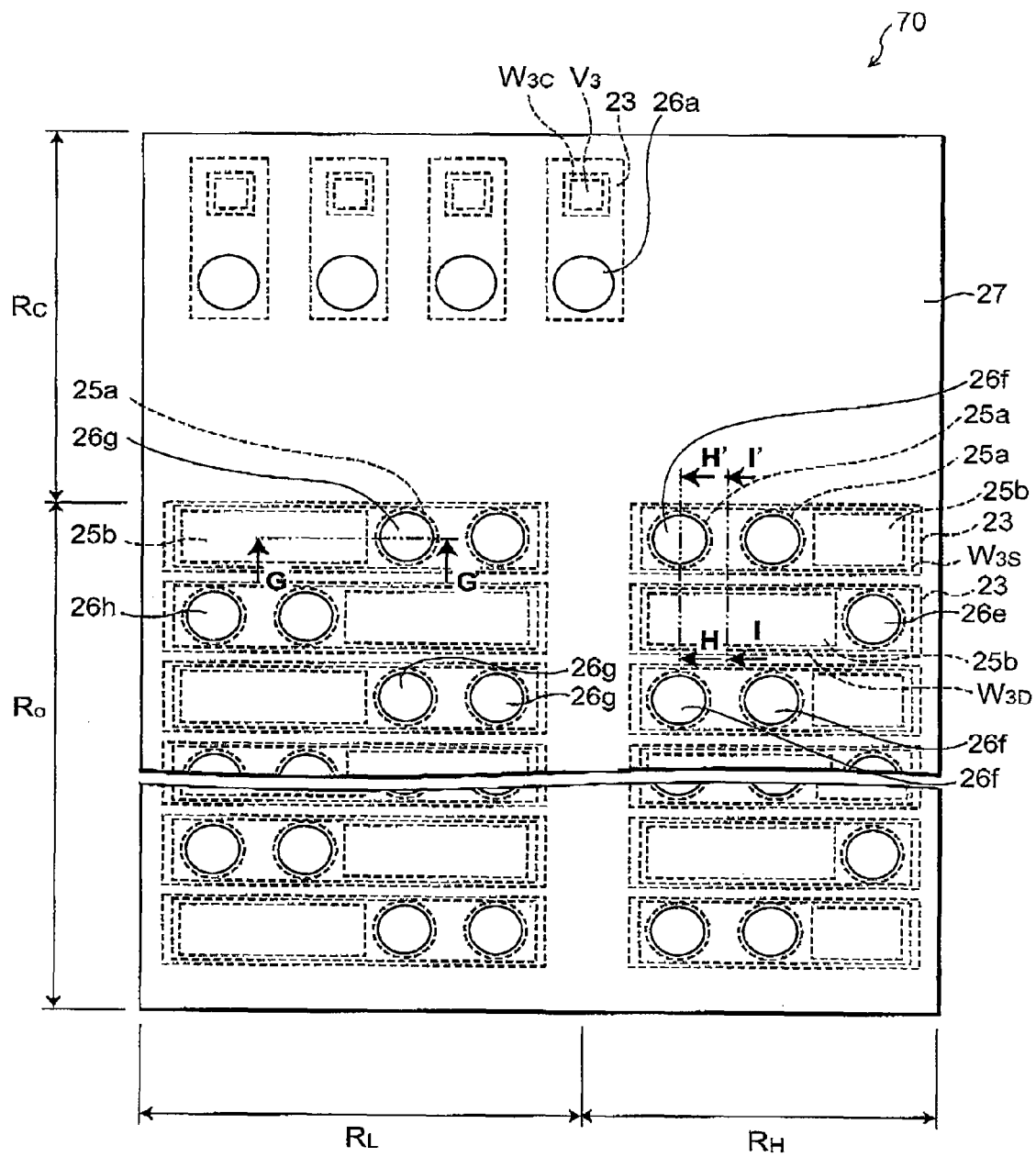
FIG. 22 is a plan view illustrating the uppermost layer of a semiconductor chip of the semiconductor device according to a fourth embodiment.

FIG. 22 is a plan view illustrating the uppermost layer of a semiconductor chip of the semiconductor device according to this embodiment.

Figure 23:
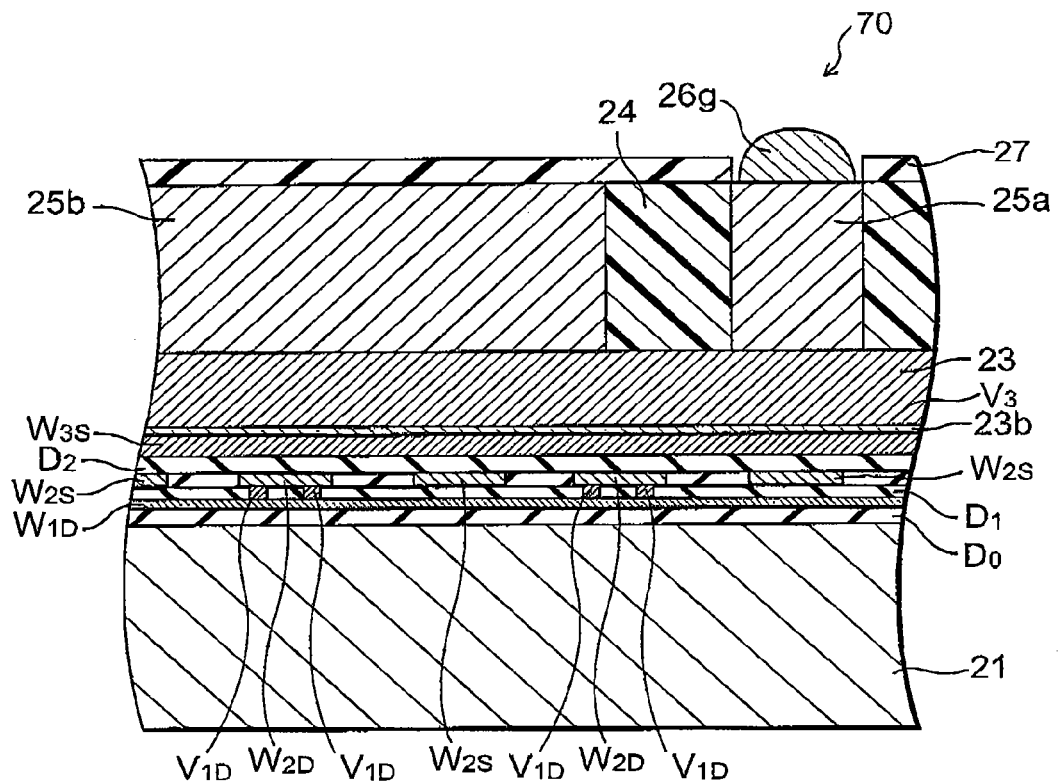
FIG. 23 is a cross-sectional view taken along line G-G' shown in FIG. 22.

FIG. 23 is a cross-sectional view taken along line G-G' shown in FIG. 22.

Figure 24:
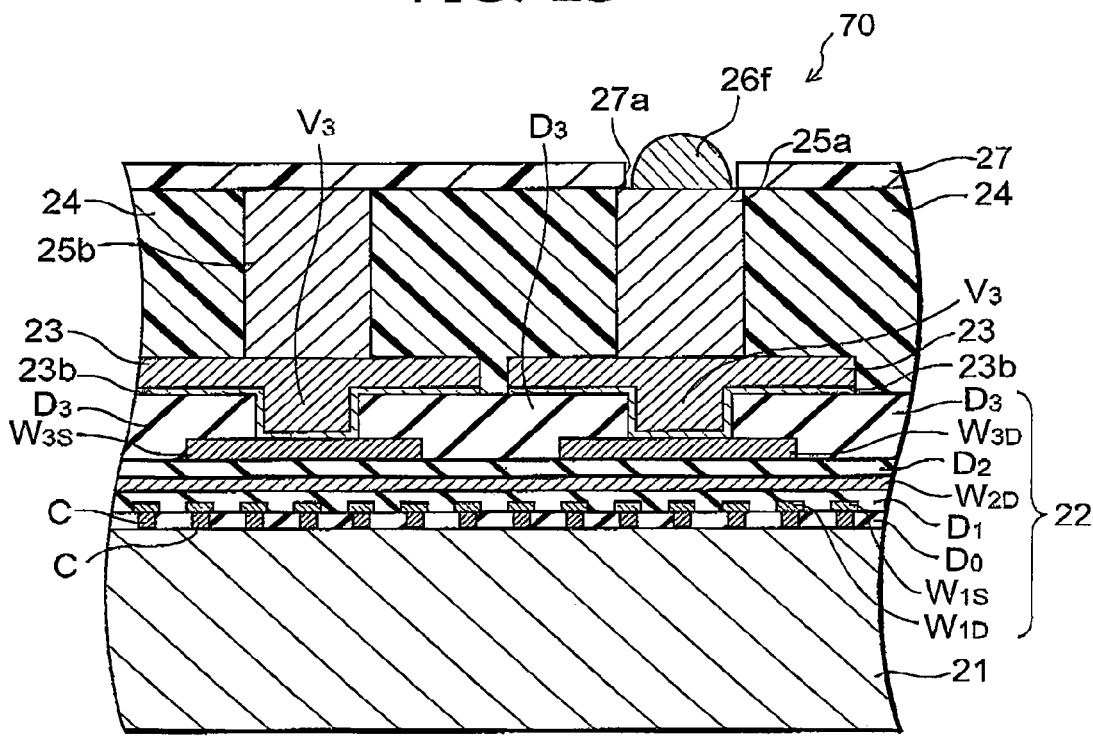
FIG. 24 is a cross-sectional view taken along line H-H' shown in FIG. 22.

FIG. 24 is a cross-sectional view taken along line H-H' shown in FIG. 22.

Figure 25:
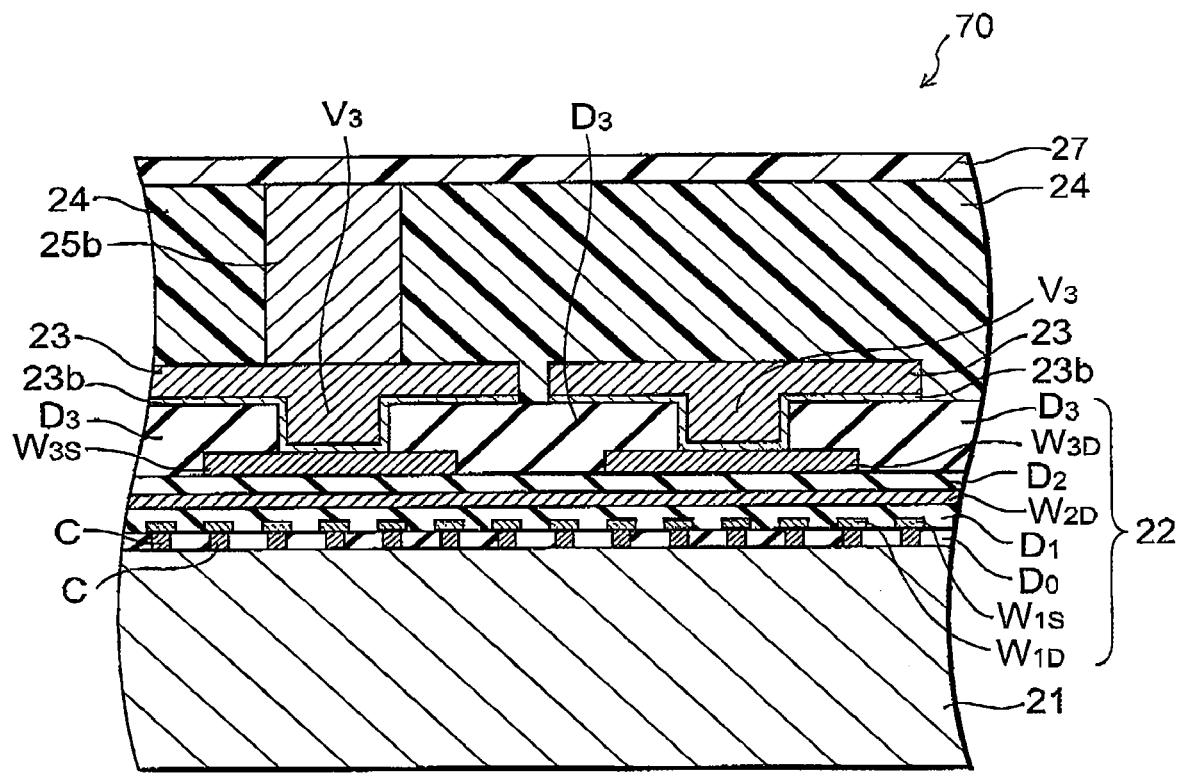
FIG. 25 is a cross-sectional view taken along line I-I' shown in FIG. 22.

FIG. 25 is a cross-sectional view taken along line I-I' shown in FIG. 22.

As shown in FIGS. 22 to 25, the semiconductor chip 70 according to this embodiment is different from the semiconductor chip 60 according to the above third embodiment (see FIG. 13) in the shape of the columnar electrode in the output circuit region $R_O$. Specifically, the columnar electrode in the third embodiment is shaped like a strip which corresponds to the shape of the uppermost wiring (third source wiring $W_{3S}$ or third drain wiring $W_{3D}$), and one columnar electrode is provided on one uppermost wiring. In contrast, the columnar electrode in the fourth embodiment is divided into the region immediately below the protruding electrode and the other region.

More specifically, in this embodiment, not one columnar electrode but two types thereof, that is, a cylindrical columnar electrode 25a and a strip-like columnar electrode 25b, are provided on each uppermost wiring. The columnar electrode 25a and the columnar electrode 25b are spaced from each other. The lower ends of the cylindrical columnar electrode 25a and the strip-like columnar electrode 25b are both connected to the uppermost wiring. On the upper surface of the cylindrical columnar electrode 25a, an opening 27a is formed in the solder resist film 27 to expose the upper surface of the columnar electrode 25a. A protruding electrode 26 is provided on this upper surface and connected to the columnar electrode 25a. On the other hand, the upper surface of the strip-like columnar electrode 25b is covered with the solder resist film 27 and not connected to a protruding electrode. The configuration of this embodiment other than the foregoing is the same as that of the above third embodiment.

Next, the operation and effect of this embodiment are described.

As described above, the protruding electrode is subjected to thermal stress due to the difference in thermal expansion coefficient between the printed circuit board and the silicon substrate 21, but this thermal stress can be relaxed by the deformation of the columnar electrode. However, use of only the strip-shaped columnar electrodes as in the third embodiment may be insufficient in the effect of relaxing thermal stress because the strip-shaped columnar electrode is less deformable in response to stress. On the other hand, use of only the cylindrical columnar electrodes increases the wiring resistance, although the effect of relaxing thermal stress is substantial.

Thus, in this embodiment, both the cylindrical columnar electrode 25a and the strip-like columnar electrode 25b are provided on each uppermost wiring Furthermore, a protruding electrode 26 is connected to the cylindrical columnar electrode 25a, and no protruding electrode is connected to the strip-like columnar electrode 25b. Thus, thermal stress applied to the protruding electrode 26 is passed to the cylindrical columnar electrode 25a, and relaxed by the deformation of this columnar electrode 25a. On the other hand, part of the current flowing horizontally through the uppermost wiring flows through the strip-like columnar electrode 25b. Thus, the resistance against the horizontally flowing current can be reduced.

Thus, this embodiment can improve the reliability of the chip against thermal stress as compared with the above third embodiment. Hence, this embodiment can realize a semiconductor device with relaxation of thermal stress and reduction of wiring resistance in balance. The operation and effect of this embodiment other than the foregoing are the same as those of the above third embodiment.

Next, a variation of the fourth embodiment is described.

Figure 26:
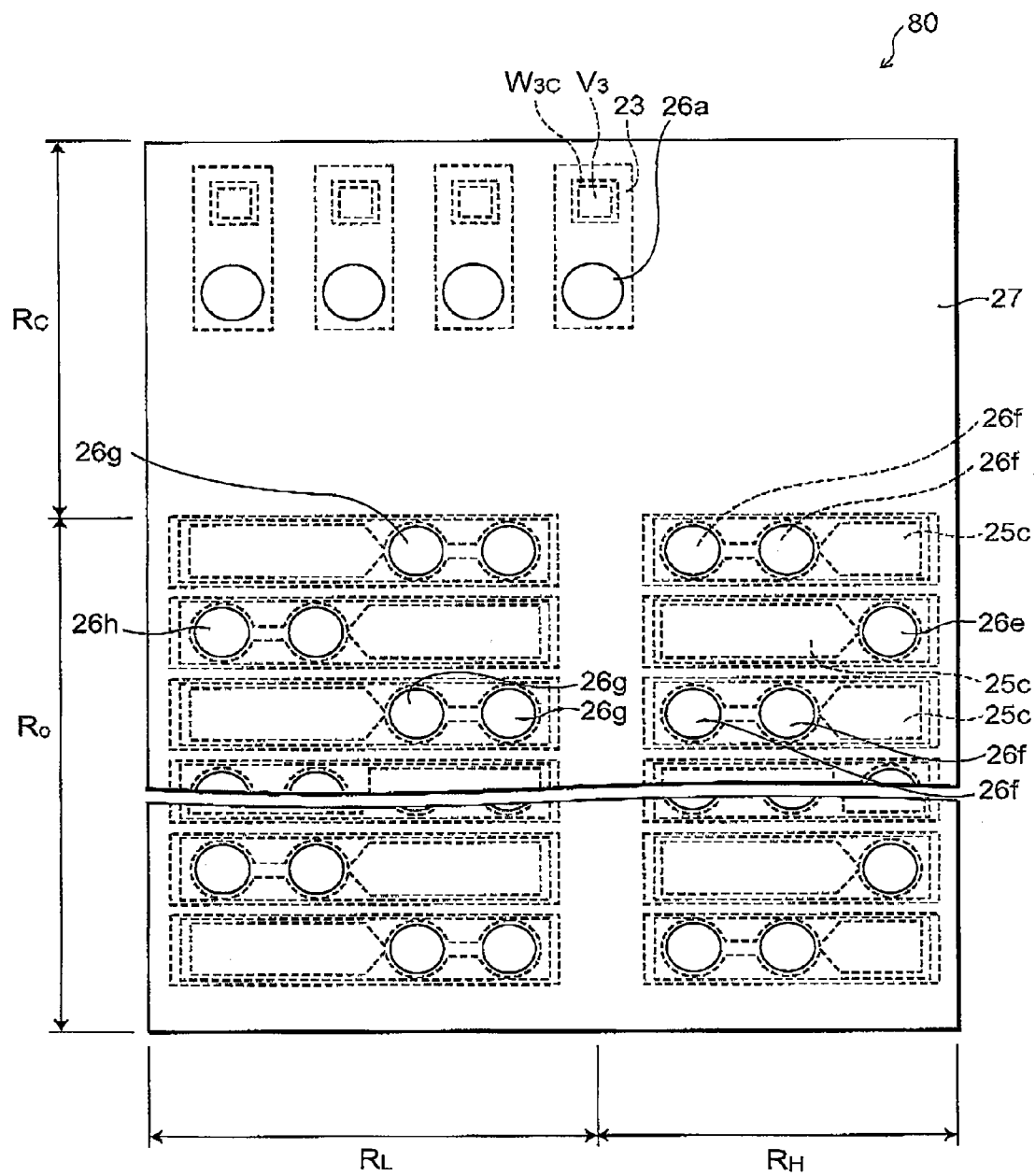
FIG. 26 is a plan view illustrating the uppermost layer of a semiconductor chip of the semiconductor device according to a variation of the fourth embodiment.

FIG. 26 is a plan view illustrating the uppermost layer of a semiconductor chip of the semiconductor device according to this variation.

Figure 27:
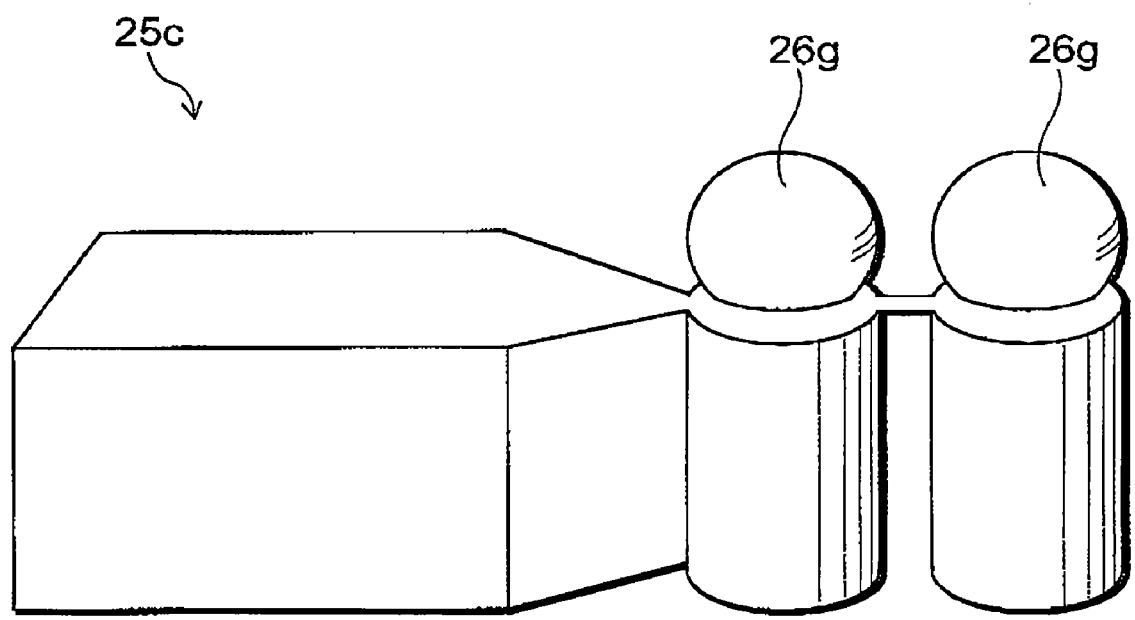
FIG. 27 is a perspective view illustrating one columnar electrode in the variation of the fourth embodiment.

FIG. 27 is a perspective view illustrating one columnar electrode in this variation.

As shown in FIGS. 26 and 27, in the semiconductor chip 80 of this variation, one columnar electrode 25c is provided on each uppermost wiring. Each columnar electrode 25c has a constriction between the region immediately below the protruding electrode and the other region. That is, the columnar electrode 25c of this variation is shaped so that the cylindrical columnar electrode 25a and the strip-like columnar electrode 25b of the fourth embodiment are linked through a thin linking portion. Thus, as compared with the above fourth embodiment, the wiring resistance can be further reduced while maintaining the effect of relaxing thermal stress. The configuration, operation, and effect of this variation other than the foregoing are the same as those of the above fourth embodiment.

Next, a fifth embodiment of the invention is described.

Figure 28:
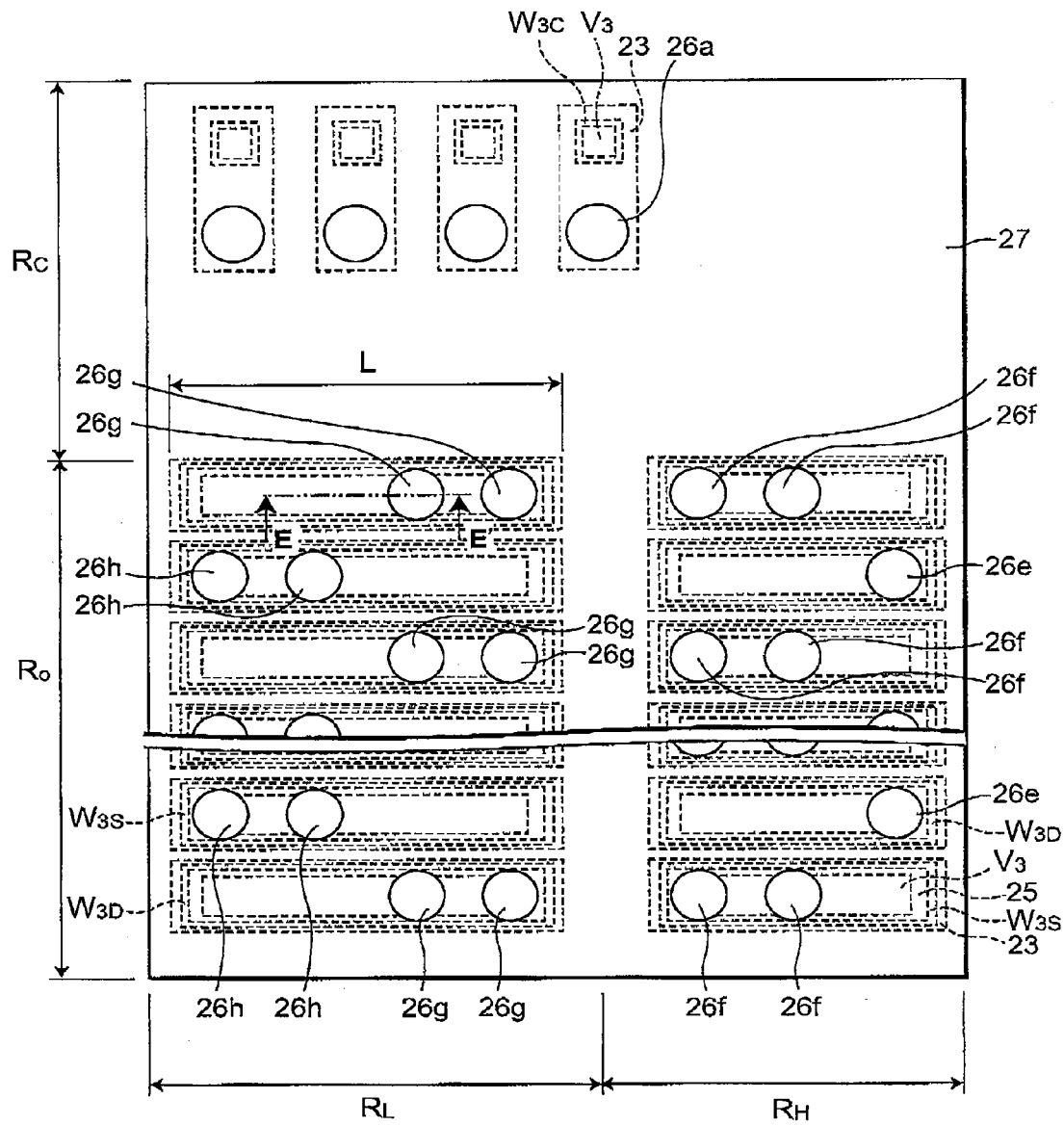
FIG. 28 is a plan view illustrating a semiconductor chip of the semiconductor device according to a fifth embodiment of the invention.

FIG. 28 is a plan view illustrating a semiconductor chip of the semiconductor device according to this embodiment.

Figure 29:
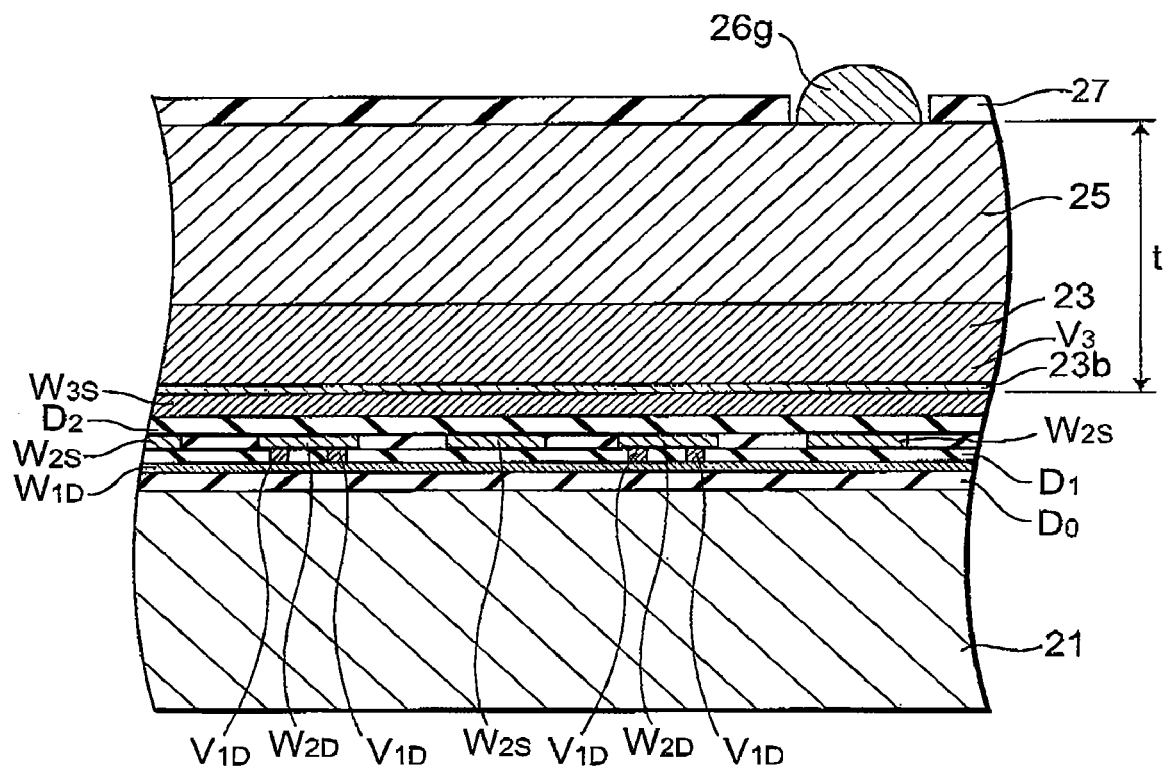
FIG. 29 is a cross-sectional view taken along line E-E' shown in FIG. 28.

FIG. 29 is a cross-sectional view taken along line E-E' shown in FIG. 28.

As shown in FIG. 29, in this embodiment, the total thickness t of the extraction wiring 23 and the columnar electrode 25 is 20 microns or more. The configuration of this embodiment other than the foregoing is the same as that of the above third embodiment.

Figure 30:
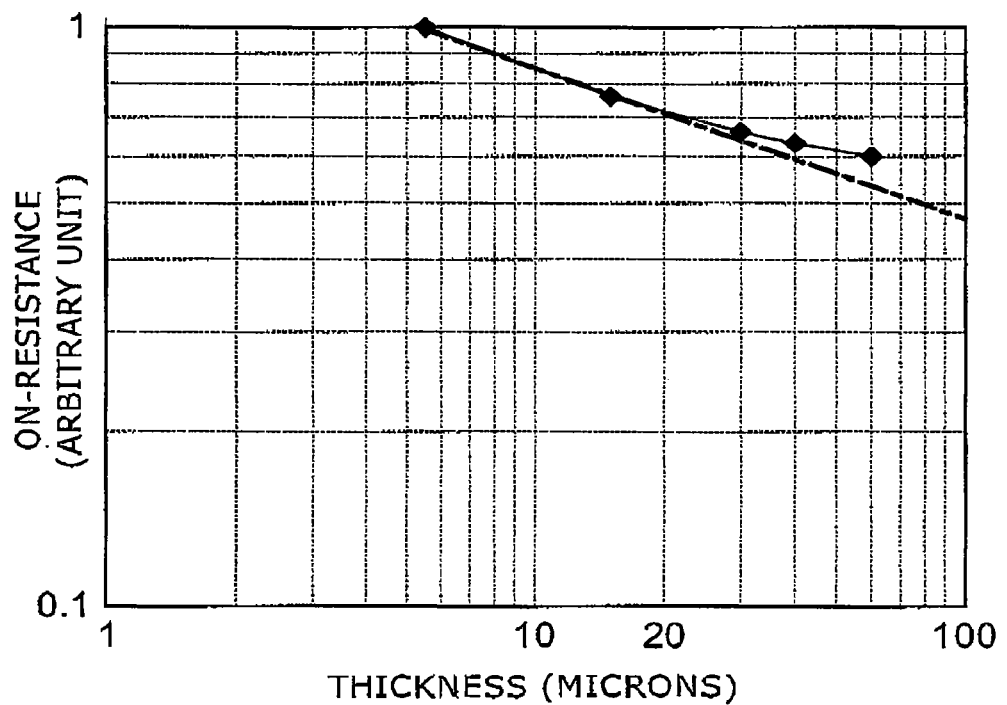
FIG. 30 is a graph of the double logarithmic plot of a simulation result, where the horizontal axis represents the total thickness t of the extraction wiring and the columnar electrode, and the vertical axis represents the on-resistance R of the low-side transistor LQ.

FIG. 30 is a graph of the double logarithmic plot of a simulation result, where the horizontal axis represents the total thickness t of the extraction wiring and the columnar electrode, and the vertical axis represents the on-resistance R of the low-side transistor LQ.

This simulation result is based on the case where the length L shown in FIG. 28, that is, the longitudinal length L of the extraction wiring 23 of the low-side region $R_L$ is 4000 microns, and the extraction wiring 23 and the columnar electrode 25 are formed from copper (Cu). In FIG. 30, the solid line represents the simulation result, and the dashed line represents the case where the on-resistance R is inversely proportional to the thickness t.

As shown in FIG. 30, the on-resistance R of the low-side transistor LQ depends on the thickness t, and decreases with the increase of the thickness t. If the on-resistance R depends only on the horizontal wiring resistance in the extraction wiring 23 and the columnar electrode 25, the on-resistance R is inversely proportional to the thickness t, and as shown by the dashed line in FIG. 30, the line representing the relationship between the on-resistance R and the thickness t ought to be straight in the double logarithmic plot. That is, log(R) and log(t) ought to be related by a linear function.

However, as shown by the solid line in FIG. 30, as the result of actual simulation, in the double logarithmic plot, when the thickness t reaches 20 microns or more, the line representing the relationship between the on-resistance R and the thickness t starts to deviate from the dashed line, and the on-resistance R does not significantly decrease despite further increase in the thickness t. Hence, the on-resistance R can be stabilized by setting the thickness t to 20 microns or more. This value of the thickness t at which the solid line starts to deviate from the dashed line is approximately 20 microns without significant variation even if the value of the length L is varied in the commonly-used range from 2000 to 5000 microns. Hence, in the case where the extraction wirings 23 and the columnar electrodes 25 are formed from copper, the thickness t is preferably 20 microns or more.

The simulation result shown in FIG. 30 is based on the case where the extraction wiring 23 and the columnar electrode 25 are formed from copper (Cu). In the case where the resistivity of the material forming the uppermost wiring and the columnar electrode is ρ (Ω·m), the preferable range of the thickness t (μm) is given by the following formula (1);

$$t \geq 1.19 \times 10^9 \times \rho \tag{1}$$

Next, a sixth embodiment of the invention is described.

Figure 31:
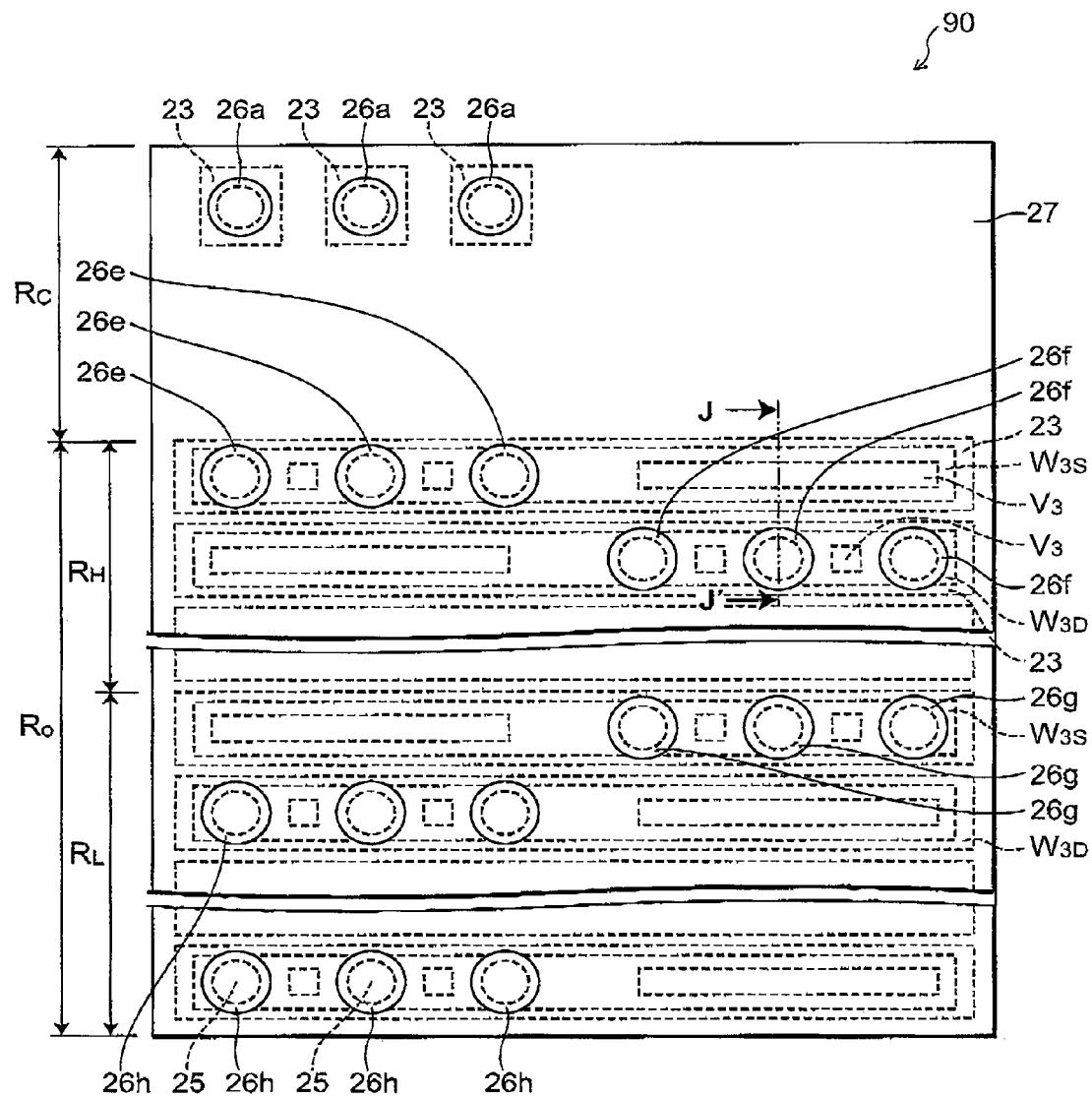
FIG. 31 is a plan view illustrating the uppermost layer of a semiconductor chip of the semiconductor device according to a sixth embodiment of the invention.

FIG. 31 is a plan view illustrating the uppermost layer of a semiconductor chip of the semiconductor device according to this embodiment.

Figure 32:
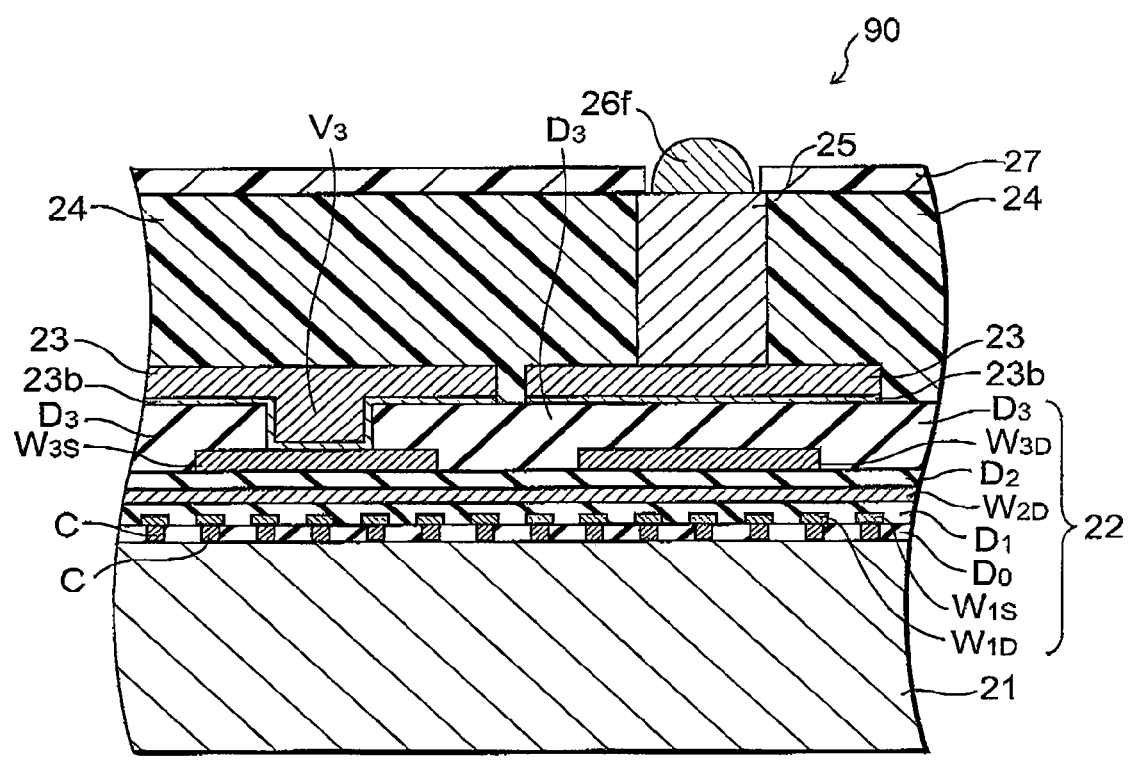
FIG. 32 is a cross-sectional view taken along line J-J' shown in FIG. 31.

FIG. 32 is a cross-sectional view taken along line J-J' shown in FIG. 31.

Figure 33:
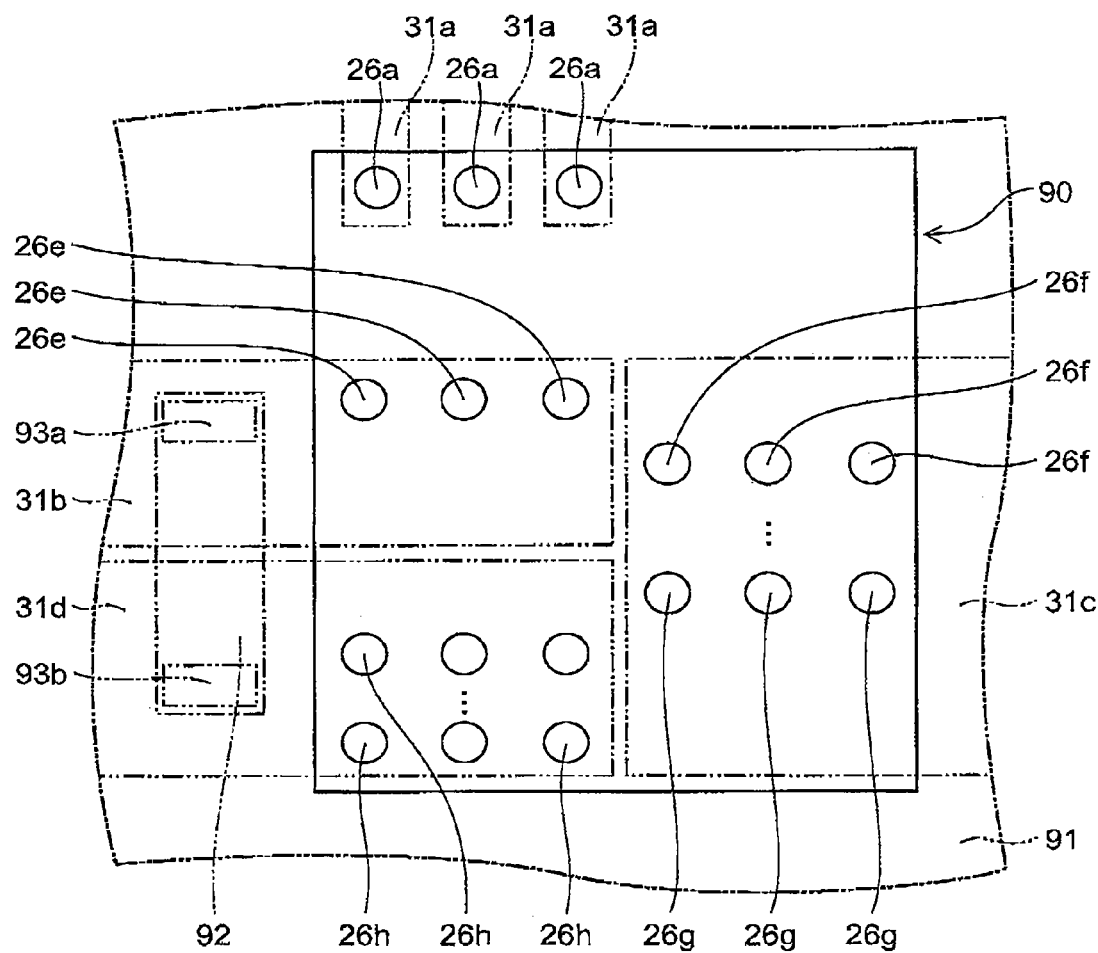
FIG. 33 is a plan view illustrating a method for connecting the semiconductor device according to the sixth embodiment.

FIG. 33 is a plan view illustrating a method for connecting the semiconductor device according to this embodiment.

As shown in FIGS. 31 and 32, the semiconductor chip 90 according to this embodiment is different from the semiconductor chip 60 according to the above third embodiment (see FIG. 13) in the arrangement direction of the high-side region $R_H$ and the low-side region $R_L$.

More specifically, as shown in FIG. 13, in the above third embodiment, the direction from the region including the protruding electrode 26f (second connecting member) to the region including the protruding electrode 26e (first connecting member) in the high-side region $R_H$, which direction is rightward in the figure, is opposite to the direction from the region including the protruding electrode 26g (second connecting member) to the region including the protruding electrode 26h (third connecting member) in the low-side region $R_L$, which direction is leftward in the figure. On the other hand, the direction from the high-side region $R_H$ to the low-side region $R_L$ is leftward in the figure. Hence, these directions are parallel to each other.

In contrast, as shown in FIG. 31, in this embodiment, the direction from the region including the protruding electrode 26f (second connecting member) to the region including the protruding electrode 26e (first connecting member) in the high-side region $R_H$, which direction is rightward in the figure, is identical to the direction from the region including the protruding electrode 26g (second connecting member) to the region including the protruding electrode 26h (third connecting member) in the low-side region $R_L$, which direction is also leftward in the figure. These directions are orthogonal to the direction from the high-side region $R_H$ to the low-side region $R_L$, which direction is downward in the figure.

As shown in FIG. 33, the semiconductor chip 90 is mounted on a printed circuit board 91. Wirings 31a, 31b, 31c, 31d are formed on the printed circuit board 91. Also in this embodiment, like the above third embodiment, the wiring 31a is connected to the protruding electrode 26a, the wiring 31b is connected to the protruding electrode 26e, the wiring 31c is connected to the protruding electrodes 26f and 26g, and the wiring 31d is connected to the protruding electrode 26h. However, as described above, this embodiment is different from the third embodiment in the arrangement of the protruding electrodes 26e-26h. Hence, the extraction direction of the wirings 31b-31d is also different. More specifically, the wiring 31b and the wiring 31d are extracted in the same direction, whereas the wiring 31c is extracted in the direction opposite to the extraction direction of the wirings 31b and 31d.

Furthermore, a capacitor 92 is mounted on the printed circuit board 91. One electrode 93a of the capacitor 92 is connected to the wiring 31b (first wiring) through solder (not shown), and the other electrode 93b is connected to the wiring 31d (second wiring) through solder (not shown). Thus, the capacitor 92 is connected between the wiring 31b and the wiring 31d. The configuration of this embodiment other than the foregoing is the same as that of the above third embodiment.

Next, the operation and effect of this embodiment are described.

Also in the DC-DC converter according to this embodiment, the current flows alternately through the wiring 31b and the wiring 31d so that a potential Vsw is outputted from the output circuit 11 (see FIG. 1). Here, the parasitic inductance of the wirings 31b and 31d causes overshoot and undershoot in the waveform of the potential Vsw. This increases switching loss and generates EMI (electromagnetic interference) noise. The parasitic inductance increases with the increase of the area of the current loop connecting between the power supply (not shown) and the output circuit 11.

Thus, in this embodiment, the capacitor 92 is connected between the wiring 31b and the wiring 31d. This allows electric power to be supplied from the capacitor 92 to the output circuit 11 and decrease the area of the current loop through which the current flows. Consequently, the parasitic inductance can be reduced.

Furthermore, as shown in FIG. 33, in this embodiment, the wiring 31b and the wiring 31d can be extracted in the same direction. Thus, the capacitor 92 can be placed near the semiconductor chip 90. Hence, the area of the current loop can be further decreased, and the parasitic inductance can be reduced more effectively. This serves to suppress overshoot and undershoot in the waveform of the output potential Vsw of the output circuit 11, reduce switching loss, and prevent EMI noise. The operation and effect of this embodiment other than the foregoing are the same as those of the above third embodiment.

Next, a seventh embodiment of the invention is described.

Figure 34:
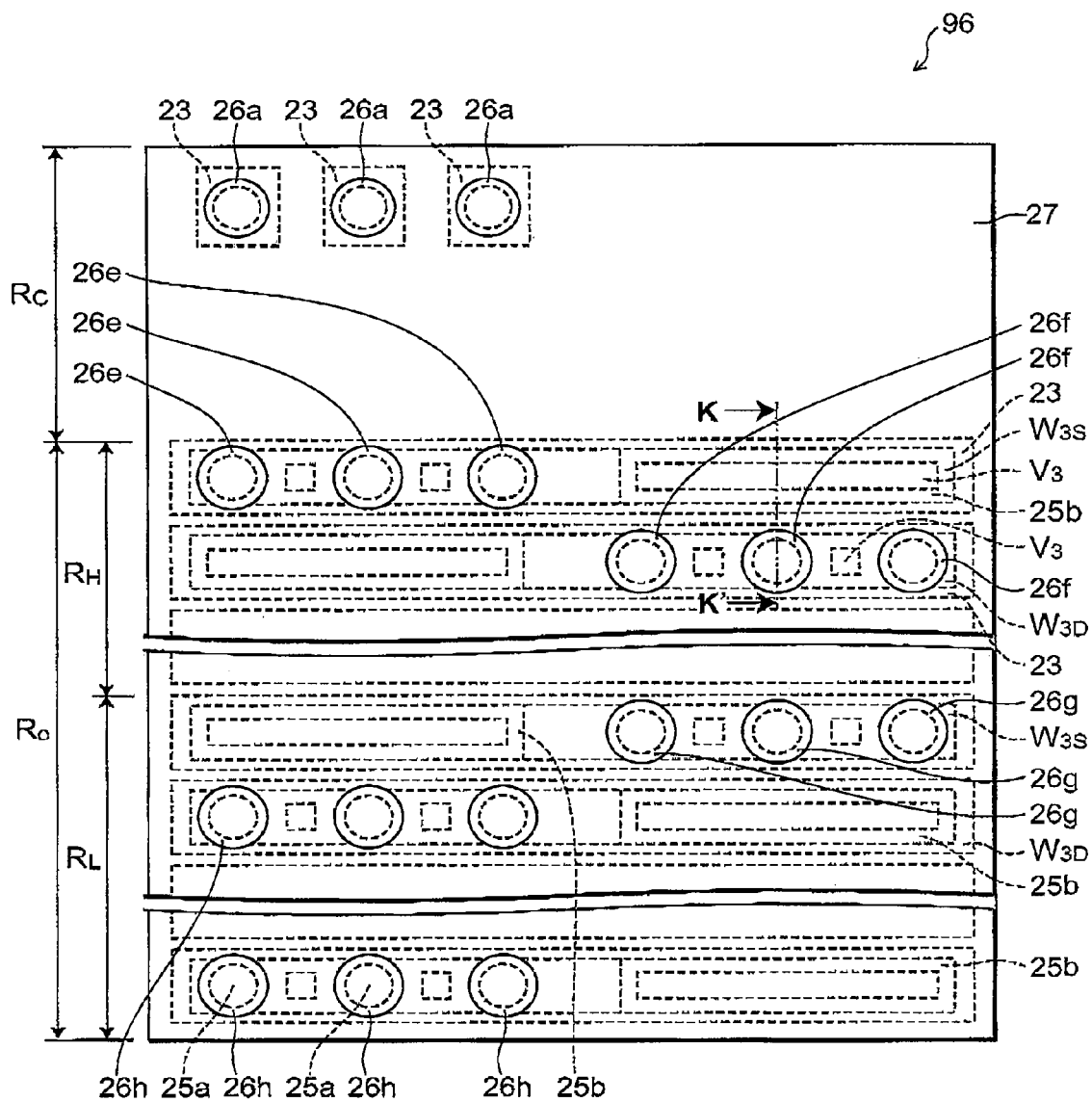
FIG. 34 is a plan view illustrating the uppermost layer of a semiconductor chip of the semiconductor device according to the seventh embodiment of the invention.

FIG. 34 is a plan view illustrating the uppermost layer of a semiconductor chip of the semiconductor device according to this embodiment.

Figure 35:
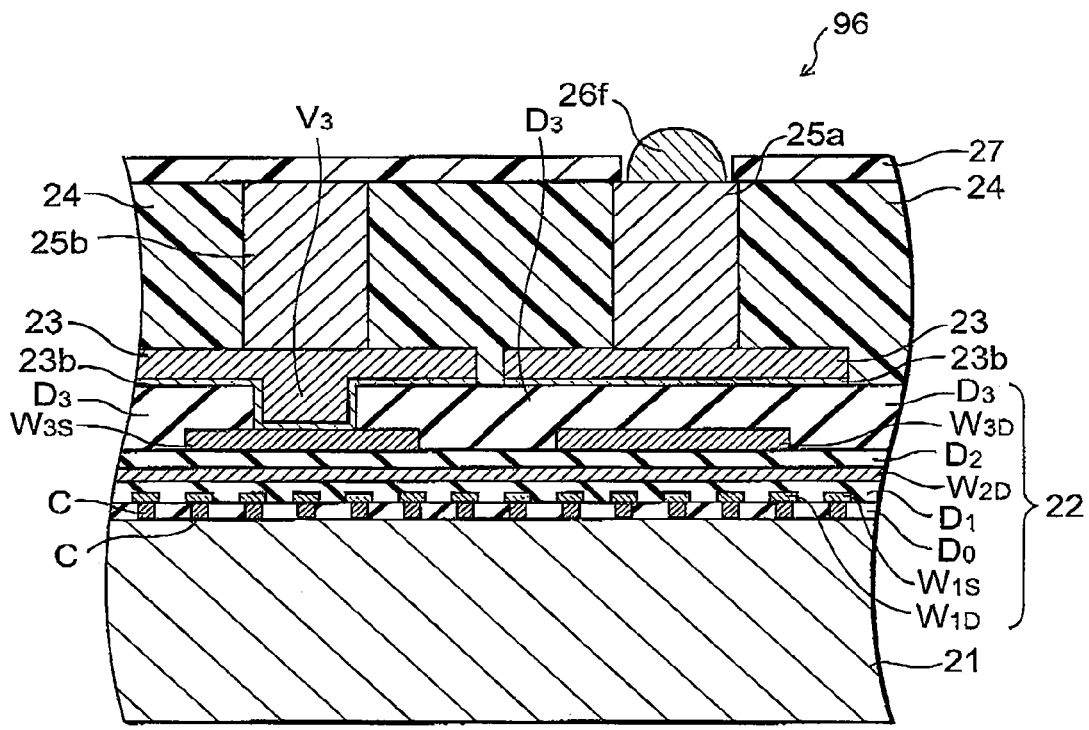
FIG. 35 is a cross-sectional view taken along line K-K' shown in FIG. 34.

FIG. 35 is a cross-sectional view taken along line K-K' shown in FIG. 34.

As shown in FIGS. 34 and 35, in the semiconductor device according to this embodiment, in addition to the configuration of the semiconductor device according to the sixth embodiment (see FIG. 31), the semiconductor chip 96 includes a strip-like columnar electrode 25b serving as a dummy electrode. The configuration of this embodiment other than the foregoing is the same as that of the above sixth embodiment.

More specifically, the semiconductor device according to this embodiment is a DC-DC converter, and the arrangement of the protruding electrodes 26a, 26e, 26f, 26g, 26h is the same as that of the above sixth embodiment. Furthermore, in this embodiment, like the above fourth embodiment, a cylindrical columnar electrode 25a and a strip-like columnar electrode 25b are provided on each uppermost wiring. The cylindrical columnar electrode 25a is connected to a protruding electrode 26, whereas the strip-like columnar electrode 25b is not connected to a protruding electrode, but serves as a dummy electrode.

According to this embodiment, the strip-like columnar electrode 25b serves to reduce the resistance against the horizontally flowing current. Thus, the on-resistance of the output circuit can be reduced. The operation and effect of this embodiment other than the foregoing are the same as those of the above sixth embodiment.

Next, an eighth embodiment of the invention is described.

Figure 36:
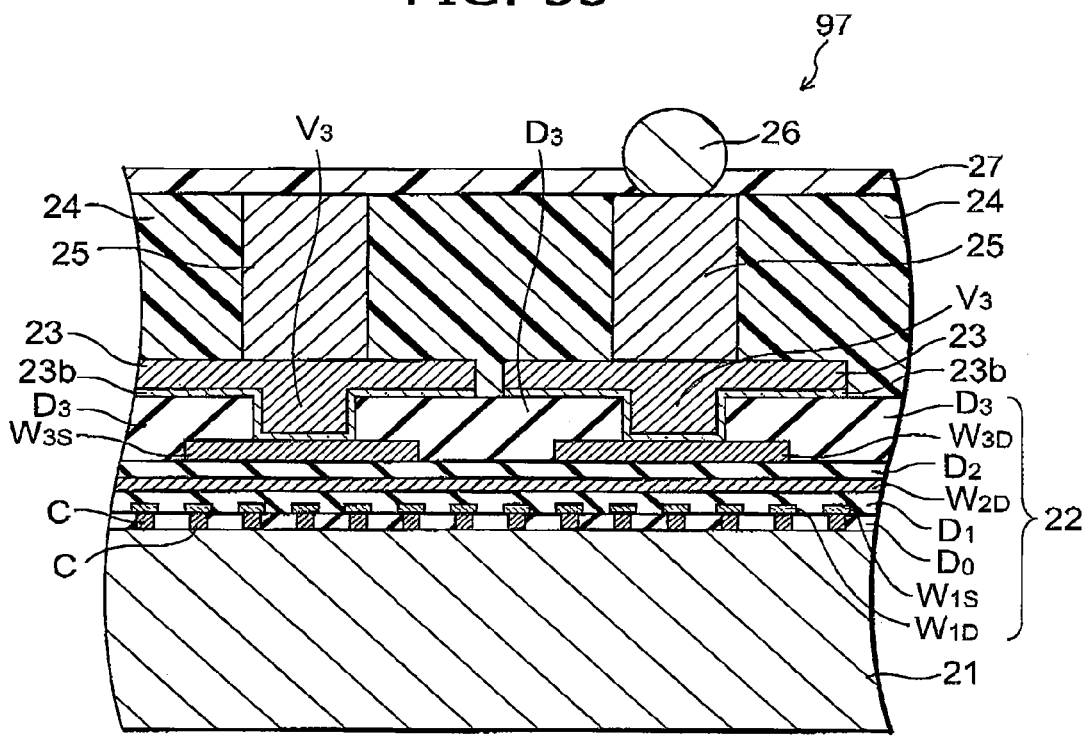
FIG. 36 is a cross-sectional view illustrating a semiconductor chip of the semiconductor device according to an eighth embodiment of the invention.

FIG. 36 is a cross-sectional view illustrating a semiconductor chip of the semiconductor device according to this embodiment.

As shown in FIG. 36, the semiconductor chip 97 according to this embodiment is different from the semiconductor chip 60 according to the above third embodiment (see FIG. 15) in that the solder resist film 27 is in contact with the lower portion of the protruding electrode 26.

Next, a method for manufacturing the semiconductor chip 97 in this embodiment is described.

Figure 37:
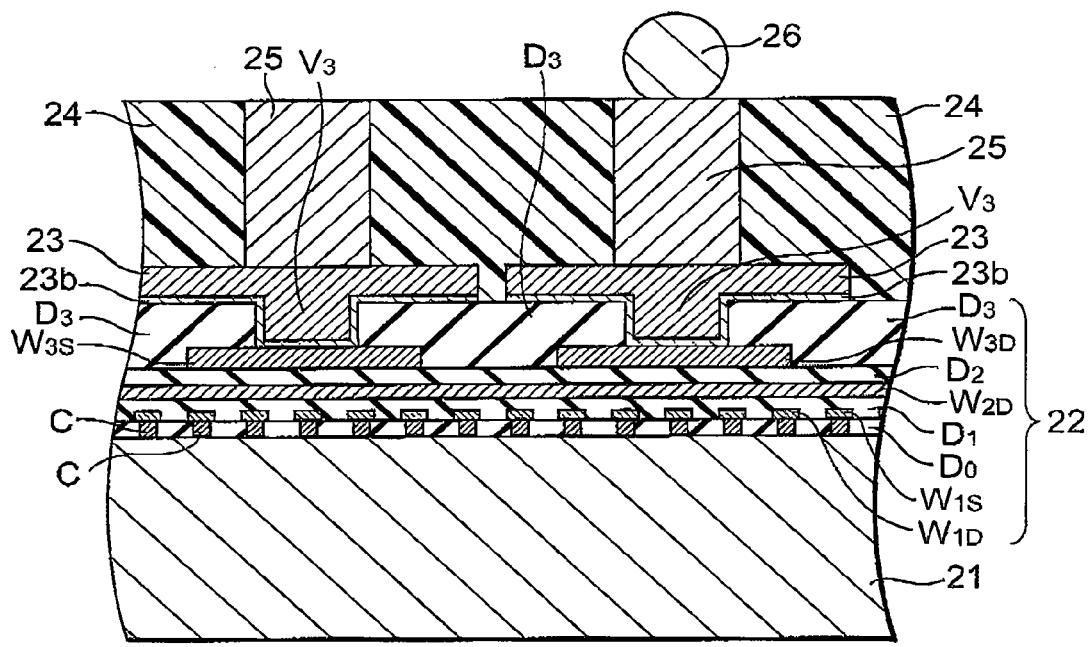
FIG. 37 is a process cross-sectional view illustrating a method for manufacturing the semiconductor chip in the eighth embodiment.
Figure 38:
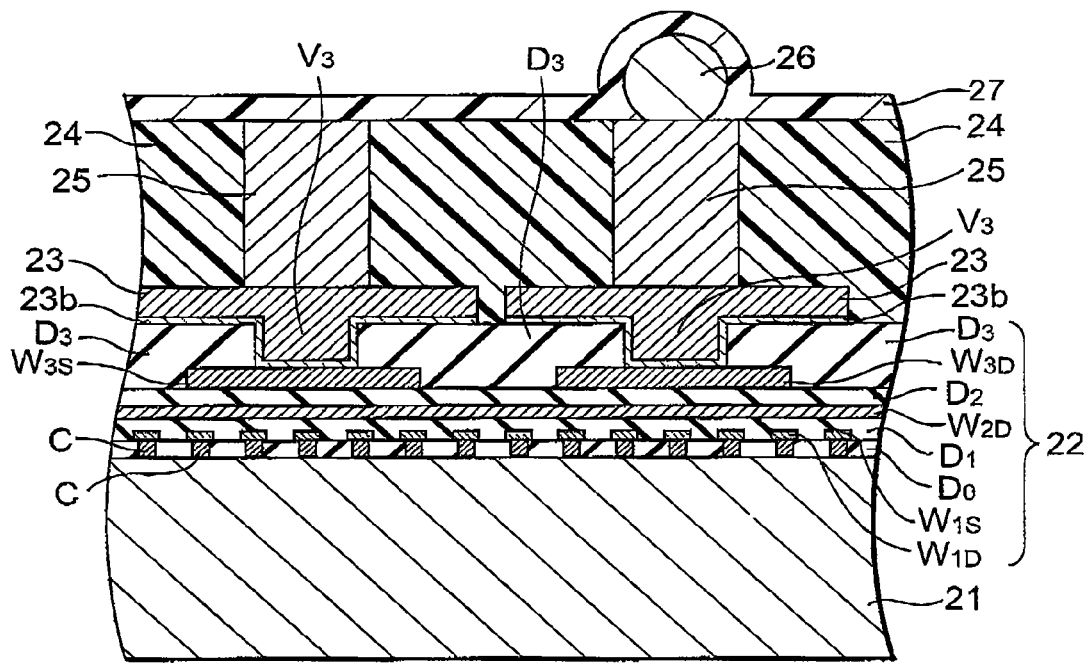
FIG. 38 is a process cross-sectional view illustrating a method for manufacturing the semiconductor chip in the eighth embodiment.

FIGS. 37 and 38 are process cross-sectional views illustrating the method for manufacturing a semiconductor chip in this embodiment.

It is noted that FIGS. 37 and 38 show the same cross section as FIG. 36.

First, the structure shown in FIG. 19 is fabricated by a method similar to that of the above third embodiment. More specifically, as shown in FIG. 17, a multilayer wiring layer 22, extraction wirings 23, and columnar electrodes 25 are formed in this order on a silicon substrate 21. Next, as shown in FIG. 18, a sealing resin layer 24 is formed on the multilayer wiring layer 22 so as to cover the extraction wirings 23 and the columnar electrodes 25. Then, as shown in FIG. 19, the upper surface of the sealing resin layer 24 is polished to achieve planarization and to expose the columnar electrodes 25.

Next, as shown in FIG. 37, a protruding electrode 26 is formed on the columnar electrode 25 illustratively by solder printing. Here, all the protruding electrodes 26 are formed simultaneously and in the same shape.

Next, as shown in FIG. 38, a solder resist film 27 is formed entirely on the upper surface of the sealing resin layer 24 and the columnar electrodes 25 so as to cover the protruding electrodes 26.

Next, as shown in FIG. 36, the upper surface portion of the protruding electrode 26 is etched away. Thus, the portion of the solder resist film 27 formed on the protruding electrode 26 is also removed together with the upper surface portion of the protruding electrode 26, and the upper portion of the protruding electrode 26 is exposed. On the other hand, the lower portion of the protruding electrode 26 remains covered with the solder resist film 27, which is in contact with the lower portion of the protruding electrode 26. Thus, the semiconductor chip 97 shown in FIG. 37 is manufactured.

According to this embodiment, the solder resist film 27 is in contact with the lower portion of the protruding electrode 26. Hence, the junction between the protruding electrode 26 and the columnar electrode 25 can be reinforced. Furthermore, by etching away the upper surface portion of the protruding electrode 26, the solder resist film 27 on the protruding electrode 26 can be removed in a self-aligned manner. Thus, as compared with the above third embodiment, there is no need of the photolithography step for forming the opening 27a (see FIG. 21) in the solder resist film 27, and the process can be simplified. The operation and effect of this embodiment other than the foregoing are the same as those of the above third embodiment.

The invention has been described with reference to the embodiments. However, the invention is not limited to these embodiments. For example, those skilled in the art can suitably modify the above embodiments by addition, deletion, or design change of components, and such modifications are also encompassed within the scope of the invention as long as they fall within the spirit of the invention.

For example, the structure of the device and the wiring is not limited to the above embodiments, but various configurations can be used. For example, the connecting members connected to the terminals of the control circuit may be the same in shape as the connecting members connected to the terminals of the output circuit. In this case, the total horizontal cross-sectional area of the plurality of connecting members connected to the terminals of the output circuit is preferably larger than the total horizontal cross-sectional area of the connecting members connected to the terminals of the control circuit.

In the above embodiments as illustrated, the protruding electrode is formed from solder. However, the invention is not limited thereto, but it is possible to use any conductive material having low melting point and being bondable by heating, such as gold. Furthermore, in the above embodiments as illustrated, the connecting member is formed from the columnar electrode and the protruding electrode. However, the invention is not limited thereto, but the connecting member may be integrally formed from solder and the like. Moreover, for example, in the case where the connecting member is placed in a portion including the immediately overlying region of the uppermost wiring of the multilayer wiring layer, the extraction wirings can be omitted. Moreover, in the above embodiments as illustrated, the semiconductor device is a DC-DC converter. However, the invention is not limited thereto, but can be suitably applied to any semiconductor device which includes a semiconductor chip mounted on a mounting board.

The invention claimed is:

1. A semiconductor device comprising:
a semiconductor substrate;
a multilayer wiring layer provided on the semiconductor substrate and constituting, in combination with the semiconductor substrate, an output circuit including a first transistor and a second transistor and a control circuit configured to control a gate potential of the first transistor and a gate potential of the second transistor;
a sealing resin layer covering the multilayer wiring layer;
a first connecting member connected to one end of the first transistor;
a second connecting member connected to another end of the first transistor and one end of the second transistor;
a third connecting member connected to another end of the second transistor; and
a fourth connecting member connected to a terminal of the control circuit,
each of the first to fourth connecting members being connected to an uppermost wiring of the multilayer wiring layer, penetrating through the sealing resin layer, and having an upper end portion protruding from an upper surface of the sealing resin layer, and
horizontal cross-sectional area of the first to third connecting members being larger than horizontal cross-sectional area of the fourth connecting member.

2. The device according to claim 1, wherein at least one of the first, second and third connecting members includes:
a columnar electrode connected to the uppermost wiring and buried in the sealing resin layer; and
a protruding electrode provided on the columnar electrode, connected to the columnar electrode, and protruding from the upper surface of the sealing resin layer.

3. The device according to claim 2, further comprising:
an extraction wiring connecting the uppermost wiring to the columnar electrode,
the columnar electrode connected to the terminals of the output circuit being provided entirely on an immediately overlying region of the extraction wiring connected to the terminals of the output circuit, and the columnar electrode connected to the terminals of the control circuit being provided partly on the immediately overlying region of the extraction wiring connected to the terminals of the control circuit.

4. The device according to claim 2, wherein the columnar electrode includes:
a first portion located in an immediately underlying region of the protruding electrode; and
a second portion located in a region outside the immediately underlying region,
wherein a constriction is formed between the first portion and the second portion.

5. The device according to claim 2, wherein all the protruding electrodes are the same in shape and size.

6. The device according to claim 2, wherein the protruding electrode is formed from solder.

7. The device according to claim 2, further comprising:
a solder resist film provided on the sealing resin layer, made of a resin material, and covering part of the upper surface of the columnar electrode.

8. The device according to claim 7, wherein the solder resist film is in contact with the protruding electrode.

9. The device according to claim 2, further comprising:
another columnar electrode that is not connected to the protruding electrode.

10. A semiconductor device comprising:
a semiconductor substrate;
a multilayer wiring layer provided on the semiconductor substrate and constituting, in combination with the semiconductor substrate, an output circuit and a control circuit configured to control the output circuit;
a sealing resin layer covering the multilayer wiring layer; and
a connecting member connected to an uppermost wiring of the multilayer wiring layer, penetrating through the sealing resin layer, and having an upper end portion protruding from an upper surface of the sealing resin layer, the connecting member including:
a columnar electrode connected to the uppermost wiring and buried in the sealing resin layer; and
a protruding electrode provided on the columnar electrode, connected to the columnar electrode, and protruding from the upper surface of the sealing resin layer,
an extraction wiring connecting the uppermost wiring to the columnar electrode,
horizontal cross-sectional area of the connecting member connected to terminals of the output circuit being larger than horizontal cross-sectional area of the connecting member connected to terminals of the control circuit, and
the following formula being satisfied:

$$t \geq 1.19 \times 10^9 \times \rho$$

where the resistivity of the material forming the extraction wiring and the columnar electrode is $\rho$ ($\Omega \cdot m$), and the total thickness of the extraction wiring and the columnar electrode is t ($\mu m$).

11. The device according to claim 10, wherein the extraction wiring and the columnar electrode are formed from copper, and the total thickness t of the extraction wiring and the columnar electrode is 20 microns or more.

12. The device according to claim 1, wherein
a higher potential is applied to the first connecting member than to the third connecting member,
a lowermost wiring of the multilayer wiring layer connected to a drain region of the first transistor is located outside an immediately overlying region of a gate electrode of the first transistor, and
a source region and a drain region of the second transistor are arranged in a checkerboard pattern, and a gate electrode of the second transistor is provided like a lattice immediately above a region between the source region of the second transistor and the drain region of the second transistor.

13. The device according to claim 1, wherein
a direction from a region including the second connecting member to a region including a first connecting member in a region including the first transistor and a direction from a region including the second connecting member to a region including the third connecting member in a region including the second transistor are opposite to each other and parallel to a direction from the region including the first transistor to the region including the second transistor, and
the first connecting member, the second connecting member, and the third connecting member are displaced with respect to each other in the direction from the region including the first transistor to the region including the second transistor.

14. The device according to claim 1, wherein a direction from a region including the second connecting member to a region including the first connecting member in a region including the first transistor and a direction from a region including the second connecting member to a region including the third connecting member in a region including the second transistor are identical to each other and orthogonal to the direction from the region including the first transistor to the region including the second transistor.

15. The device according to claim 1, further comprising:
a printed circuit board on which the semiconductor substrate is mounted;
a first wiring formed on the printed circuit board and bonded to the first connecting member;
a second wiring formed on the printed circuit board and bonded to the third connecting member; and
a capacitor mounted on the printed circuit board and connected between the first wiring and the second wiring.

16. The device according to claim 15, wherein the first wiring and the second wiring are extracted in the same direction.

17. The device according to claim 1, further comprising:
an inductor connected between the second connecting member and an output terminal; and
a capacitor connected between the output terminal and a reference potential.

18. A method for manufacturing a semiconductor device, comprising:
forming a multilayer wiring layer on a semiconductor substrate, the multilayer wiring layer constituting, in combination with the semiconductor substrate, an output circuit and a control circuit configured to control the output circuit;
forming an extraction wiring on the multilayer wiring layer, the extraction wiring being connected to an uppermost wiring of the multilayer wiring layer;
forming a columnar electrode on the extraction wiring;
forming a sealing resin layer on the multilayer wiring layer so as to cover the extraction wiring and the columnar electrode;
polishing an upper surface of the sealing resin layer to expose the columnar electrode;
forming a solder resist film on the sealing resin layer and the columnar electrode;
removing a portion of the solder resist film located immediately above the columnar electrode to form an opening; and
forming a protruding electrode in the opening,
horizontal cross-sectional area of the columnar electrode and the protruding electrode connected to terminals of the output circuit being larger than horizontal cross-sectional area of the columnar electrode and the protruding electrode connected to terminals of the control circuit.

19. A method for manufacturing a semiconductor device, comprising:
forming a multilayer wiring layer on a semiconductor substrate, the multilayer wiring layer constituting, in combination with the semiconductor substrate, an output circuit and a control circuit configured to control the output circuit;
forming an extraction wiring on the multilayer wiring layer, the extraction wiring being connected to an uppermost wiring of the multilayer wiring layer;
forming a columnar electrode on the extraction wiring;
forming a sealing resin layer on the multilayer wiring layer so as to cover the extraction wiring and the columnar electrode;
polishing an upper surface of the sealing resin layer to expose the columnar electrode;
forming a plurality of protruding electrodes on the columnar electrode;
forming a solder resist film on the sealing resin layer and the columnar electrode so as to cover the protruding electrodes; and
removing a portion of the solder resist film formed on the protruding electrodes,
horizontal cross-sectional area of the columnar electrode and the protruding electrode connected to terminals of the output circuit being larger than horizontal cross-sectional area of the columnar electrode and the protruding electrode connected to terminals of the control circuit.

20. The device according to claim 14, further comprising:
a printed circuit board on which the semiconductor substrate is mounted;
a first wiring formed on the printed circuit board and bonded to the first connecting member;
a second wiring formed on the printed circuit board and bonded to the third connecting member; and
a capacitor mounted on the printed circuit board and connected between the first wiring and the second wiring,
the first wiring and the second wiring being extracted in the same direction.

* * * * *